(12) United States Patent
Gracias et al.

(10) Patent No.: US 11,535,510 B2
(45) Date of Patent: Dec. 27, 2022

(54) SELF-FOLDING SUB-CENTIMETER STRUCTURES

(75) Inventors: David H. Gracias, Baltimore, MD (US); Anum Azam, Berkeley, CA (US)

(73) Assignee: The Johns Hopkins University, Baltimore, MD (US)

(*) Notice: Subject to any disclaimer, the term of this patent is extended or adjusted under 35 U.S.C. 154(b) by 0 days.

(21) Appl. No.: 13/643,944

(22) PCT Filed: Apr. 27, 2011

(86) PCT No.: PCT/US2011/034200
§ 371 (c)(1),
(2), (4) Date: Oct. 26, 2012

(87) PCT Pub. No.: WO2011/139796
PCT Pub. Date: Nov. 10, 2011

(65) Prior Publication Data
US 2013/0045530 A1 Feb. 21, 2013

Related U.S. Application Data

(60) Provisional application No. 61/328,462, filed on Apr. 27, 2010.

(51) Int. Cl.
*B32B 1/02* (2006.01)
*B81C 1/00* (2006.01)

(52) U.S. Cl.
CPC ...... *B81C 1/00007* (2013.01); *B81B 2201/06* (2013.01); *B81B 2203/0315* (2013.01); *Y10T 403/74* (2015.01); *Y10T 428/1397* (2015.01); *Y10T 428/19* (2015.01)

(58) Field of Classification Search
None
See application file for complete search history.

(56) References Cited

U.S. PATENT DOCUMENTS

| 2007/0020310 A1 | 1/2007 | Gracias et al. | |
|---|---|---|---|
| 2008/0294088 A1* | 11/2008 | Solem et al. | 604/22 |
| 2009/0311190 A1 | 12/2009 | Gracias et al. | |
| 2011/0250092 A1* | 10/2011 | Foster | G01N 15/1459 422/73 |

FOREIGN PATENT DOCUMENTS

| EP | 1 192 006 B1 | 6/2000 |
|---|---|---|
| JP | 2003-502656 | 1/2003 |

OTHER PUBLICATIONS

"Compactness Determines the Success of Cube and Octahedron Self-Assembly," Azam, A., et al., BPLos One 4(2): e4451 (2009).*
"Patterning Thin Film Mechanical Properties to Drive Assembly of Complex 3D Structures," Bassik, N., et al., Adv. Mater. 20: 4760-4764 (2008).*
Leong, T., et al., "Thin Film Stress Driven Self-Folding of Microstructured Containers," small 4(10): 1605-1609 (2008).*
Gracias, D., "Tetherless, 3D, Micro-Nanoscale Tools and Devices for Lab on a Chip Applications," Mater. Res. Soc. Symp. Proc. Spring (Apr. 13-17, 2009) 1191 (2009).*
Bassik, N., et al., "Patterning Thin Film Mechanical Properties to Drive Assembly of Complex 3D Structures," Adv. Mater. 20: 4760-4764 (2008).*
Leong, T., et al., "Spatially Controlled Chemistry Using Remotely Guided Nanoliter Scale Containers," J. Am. Chem. Soc. 128: 11336-11337 (2006).*
Randall, C., et al., "3D lithographically fabricated nanoliter containers for drug delivery," Advanced Drug Delivery Reviews 59: 1547-1561 (2007).*
Bassik, N., et al., Adv. Mater. 20: 4760-4764 (2008).*
"Micro-Chem SU-8 3000," available on the Internet at <http://www.microchem.com/pdf/SU-8%203000%20Data-%20Sheet.pdf>, as accessed Jan. 24, 2017.*
Ping, P., et al., Biomacromolecules 6: 587-592 (2005). (Year: 2005).*
International Search Report and Written Opinion of PCT/US2011/034200.
Christina L. Randall, et al., "Three-dimensional microwell arrays for cell culture", Lab Chip, 2011, 11, pp. 127-131.
Anum Azam, et al., "Sel-folding micropatterned polymeric containers", Biomed Microdevices (2011), 13., pp. 51-58.

* cited by examiner

Primary Examiner — David J Blanchard
Assistant Examiner — Daniel F Coughlin
(74) Attorney, Agent, or Firm — Venable LLP; Henry J. Daley

(57) ABSTRACT

A sub-centimeter structure includes a first structural component, a second structural component arranged proximate the first structural component, and a joint connecting the first and second structural components. The joint includes a material that has a first phase that is substantially rigid to hold the first and second structural components in a substantially rigid configuration while the material is in the first phase. The material of the joint has a second phase such that the joint is at least partially fluid to allow the first and second structural components to move relative to each other while the material is in the second phase. The joint interacts with the first and second structural components while the material is in the second phase to cause the first and second structural components to move relative to each other. And, the first and second structural components include a polymer.

25 Claims, 11 Drawing Sheets

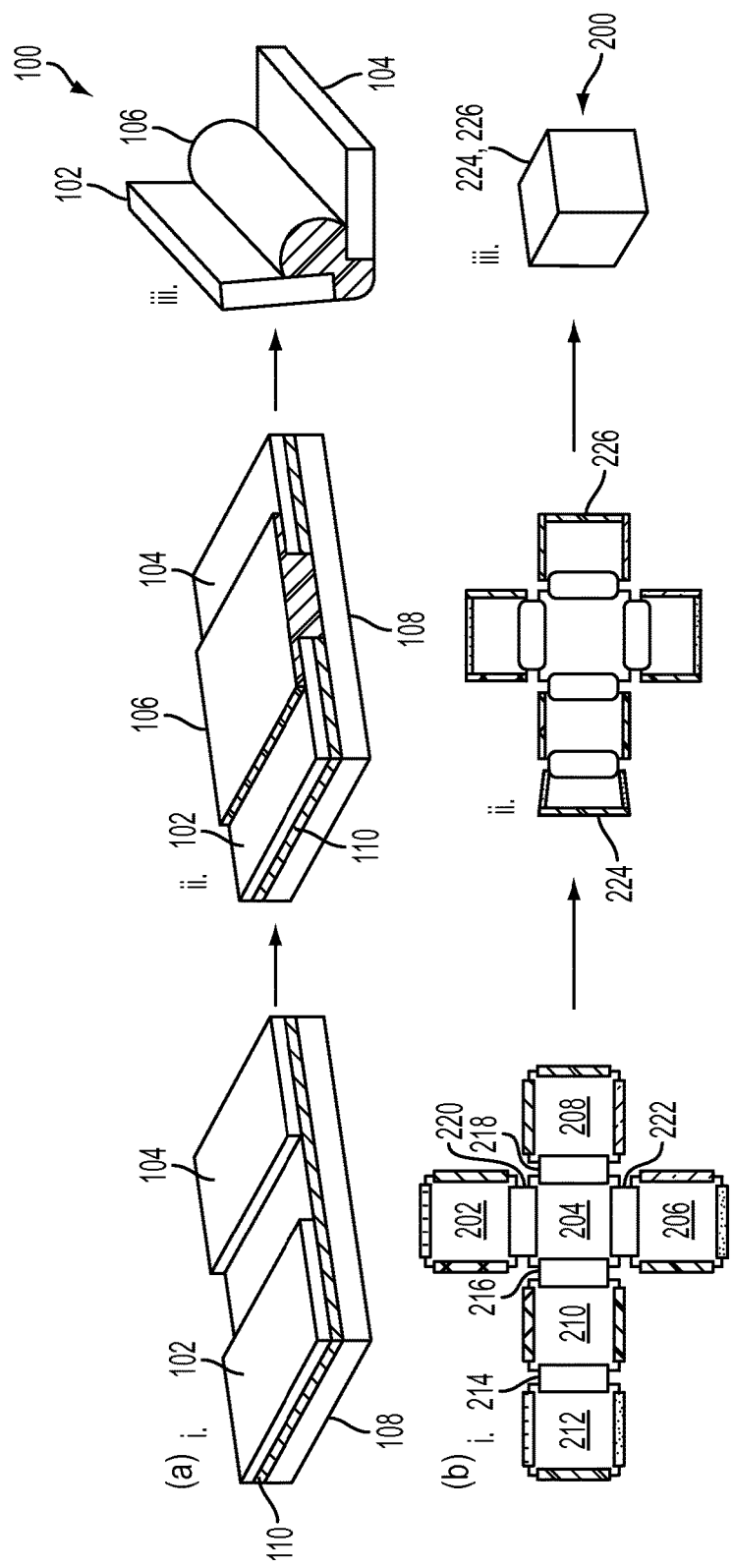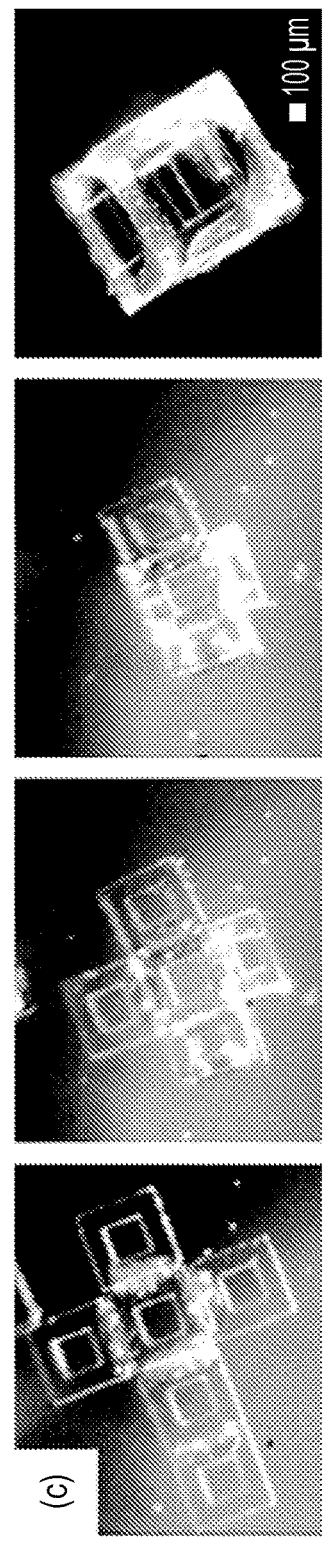
FIG. 1a-1c

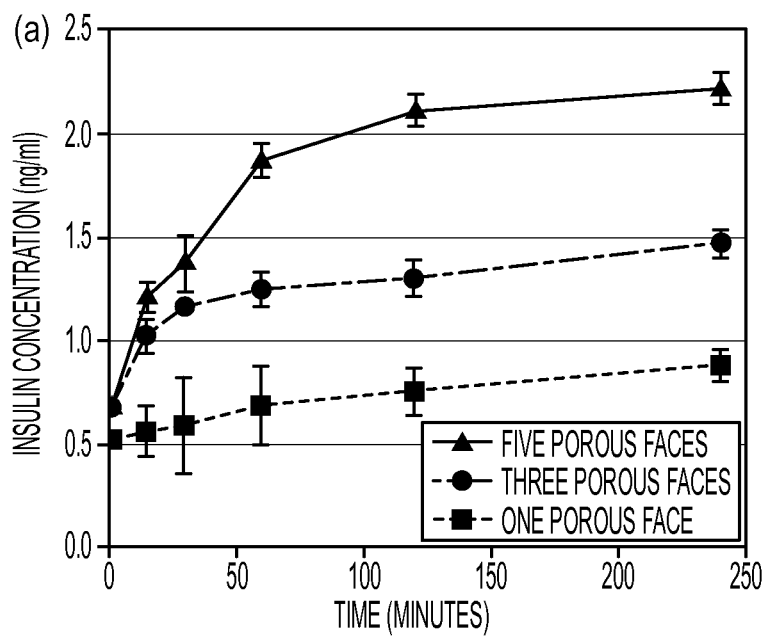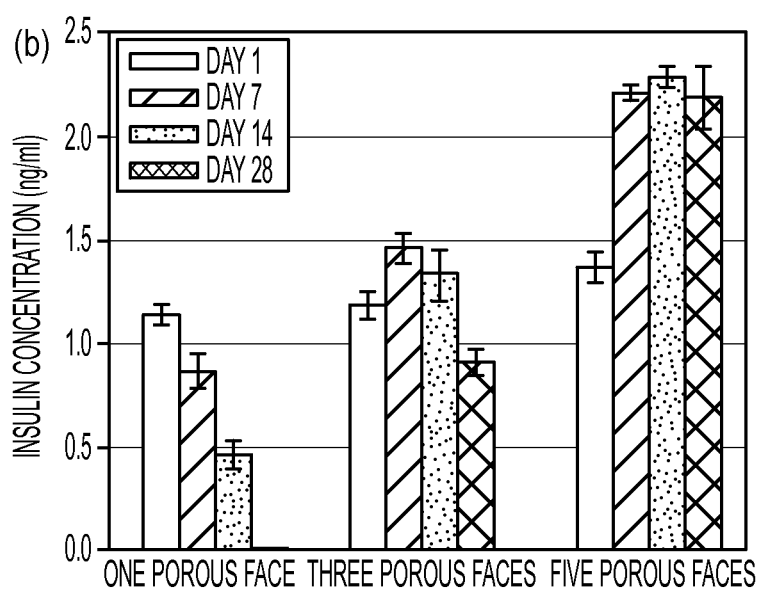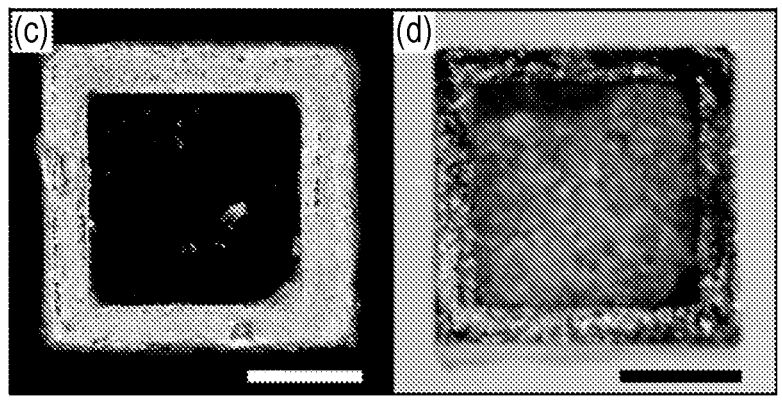
FIG. 11a-11d

SELF-FOLDING SUB-CENTIMETER STRUCTURES

CROSS-REFERENCE OF RELATED APPLICATION

This is a national stage application under 35 U.S.C. § 371 of PCT/US2011/034200 filed Apr. 27, 2011, the entire contents of which are incorporated herein by reference and claims priority to U.S. Provisional Application No. 61/328,462 filed Apr. 27, 2010, the entire contents of which are hereby incorporated by reference.

This invention was made with Government support of Grant No. 1-DP2-OD004346-01 awarded by the Department of Health and Human Services, The National Institutes of Health. The U.S. Government has certain rights in this invention.

BACKGROUND

1. Field of Invention

The field of the currently claimed embodiments of this invention relates to self-folding structures, and more particularly to self-folding structures that are smaller than 1 cm in a folded configuration.

2. Discussion of Related Art

Over the last several years, self-folding methods for transforming lithographically patterned 2D templates into hollow microcontainers have been developed (B. Gimi, et al., *Biomed. Microdev.* 2005, 7, 341-345 (2005); T. G. Leong, et al., *Langmuir* 23:8747-8751 (2007)). These containers also feature precise patterning of pores in all three dimensions. Containers known in the art, however, have a primarily metallic composition to facilitate photolithographic patterning and wet etching. Although the metallic containers interact with electromagnetic fields to enable remote heating (H. Ye, et al., *Angew. Chem.* 46:4991-4994 (2007)) and imaging (B. Gimi, et al., *Cell Trans.* 16:403-408 (2007)), and containers coated with gold have been shown to be nontoxic to cells, such containers lack other important features, such as biodegradability and optical transparency. Polymers, however, remain the material of choice in constructing devices for cell encapsulation therapy, tissue engineering and drug delivery (S. Prakash, H. Soe-Lin, *Trends Biomat. Artif. Organs*, 18:24-35 (2004)).

Therefore, there remains a need for improved self-folding structures and methods of producing the self-folding structures.

SUMMARY

A sub-centimeter structure according to an embodiment of the current invention includes a first structural component, a second structural component arranged proximate the first structural component, and a joint connecting the first and second structural components. The joint includes a material that has a first phase that is substantially rigid to hold the first and second structural components in a substantially rigid configuration while the material is in the first phase. The material of the joint has a second phase such that the joint is at least partially fluid to allow the first and second structural components to move relative to each other while the material is in the second phase. The joint interacts with the first and second structural components while the material is in the second phase to cause the first and second structural components to move relative to each other. And, the first and second structural components include a polymer.

An array according to an embodiment of the current invention includes a plurality of the above-noted sub-centimeter structures.

A composition according to an embodiment of the current invention includes a plurality of the above-noted sub-centimeter structures.

A method of producing a sub-centimeter structure according to an embodiment of the current invention includes providing a first structural component, providing a second structural component proximate the first structural component, providing a joint connecting the first and second structural components, and exposing the joint to heat such that the joint changes phase from a substantially solid material to an at least partially fluid material such that the joint interacts with the first and second structural components to cause the first and second structural components to move relative to each other in a substantially predetermined motion. The first and second structural components comprise a polymer.

BRIEF DESCRIPTION OF THE DRAWINGS

Further objectives and advantages will become apparent from a consideration of the description, drawings, and examples.

FIGS. 1a-1c illustrate a representative fabrication process flow and self-folding sub-centimeter structure for an example of polymeric microcontainers according to an embodiment of the current invention. In FIG. 1a: (i) a clean silicon wafer is spin-coated with a sacrificial layer. SU-8 panels are patterned using conventional photolithography. (ii) PCL is deposited in hinge gaps. (iii) Structures are lifted off via dissolution of a polyvinyl alcohol (PVA) layer in water and self-assembly occurs above 50° C. In FIG. 1b, schematic diagrams i-iii demonstrate self-folding of a cubic container according to an embodiment of the current invention. External "locking" hinges in pairs are mating edges in the folded configuration. FIG. 1c is a video capture sequence (over 15 seconds) showing a 1-mm/side, six-windowed polymeric microcontainer self-folding at 60° C. according to an embodiment of the current invention.

FIG. 2a is a fluorescent image of a group of 1 mm/side closed faced polymeric microcontainers according to an embodiment of the current invention. FIG. 2b is a fluorescent image of 500 µm/side polymeric cubes with isotropic porosity. The pores are square shaped with dimensions of 73×73 µm, arranged in 3×3 arrays on each face. FIG. 2c is an optical image of a 1-mm/side polymeric microcontainer with isotropic porosity. Each face is patterned with 8 µm-diameter round pores in a 20×20 array, as shown in the magnified inset. FIG. 2d is a schematic illustration showing self-assembly and optical curing of self-folded cubic containers into 3D scaffold-like geometries according to an embodiment of the current invention. The containers are functionalized with a hydrophobic adhesive and agitated in a vial of water, to form an aggregate, which is then fixed in place by curing the adhesive using UV light. FIG. 2e is a bright field image of a 2×2 mm polymeric cube-array FIG. 3a is a fluorescence image of a group of 1 mm sized, non-porous polymeric containers. FIG. 3b is a fluorescence image of 500 µm sized polymeric cubes with isotropic porosity. The pores are square shaped with dimensions of 73×73 µm and are precisely arranged in a 3×3 array on each face. FIG. 3c is a bright-field image of a 500 µm sized polymeric container with isotropic porosity. Here, each face has five precisely patterned 125 µm-diameter, circular-shaped pores. FIG. 3d is a bright-field image of a 1 mm sized polymeric container with 8 µm diameter circular-shaped pores in a 20×20 array. FIG. 3e is a bright-field image of a 1 mm sized container with a single square 500 µm pore and with a single microbead encapsulated within. FIG. 3f is a fluorescence image of a self-folded 500 µm sized dodecahedron with a single 250 µm sized pentagonal pore on each face.

FIG. 4a shows multicolored micro-beads encapsulated in six-faced polymeric containers, with 500 µm square pores in the center of each face. FIG. 4b shows a bright-field image of a gelatin-coated polymeric container retaining encapsulated Trypan blue dye. The dye-loaded container was coated with a ~2 µm thick layer of gelatin from bovine skin, type B (Sigma Aldrich) on all sides by pipetting 3 mL of 2% gelatin solution on a Teflon-coated glass slide and agitating the container in the solution. FIG. 4c is a bright-field and FIG. 4d a fluorescence z-plane stack image of stained fibroblast cells encapsulated within a non-porous polymeric container. The green color indicates that the cells are alive. FIGS. 4e and 4f are bright-field and fluorescence images of Artemia eggs encapsulated in porous polymeric cubes. Individual eggs are circled on the image.

FIG. 5a is a bright-field image of pancreatic cells in a container immediately following encapsulation by tumbling. FIG. 5b is a fluorescence image of stained pancreatic cells 60 h following encapsulation. FIG. 5c is a bright-field image and FIG. 5d is a fluorescence image of pancreatic cells 180 h following encapsulation.

FIG. 6a shows bright-field and fluorescence images of Syto 9 stained E. coli encapsulated within a polymer container, 24 h after encapsulation. FIG. 6b shows bright-field time-lapse images of bacteria within a polymeric container, taken at intervals of zero, 4 and 15 h following encapsulation by tumbling. Also shown is a plot of the number of bacteria vs. culture time following encapsulation. The Roman numeral labels on the graph correspond to the time points at which the images were obtained.

FIG. 8a is a conceptual schematic of a conventional 2D microwell array and FIG. 8b is an example of a 3D microwell array according to an embodiment of the current invention. FIGS. 8c-8f show numerical simulations and comparison of cell viability in a single 2D versus 3D porous microwell with cylindrical geometry. Spatial variation of viable (marbled) and necrotic (cross hatched) cells within a microwell with FIG. 8c one porous face (a conventional 2D microwell) and FIG. 8d a microwell with porosity on all faces except the one at the bottom according to an embodiment of the current invention. The $O_2$ concentration outside the microwell is color coded as per the legend in the figure and the arrows represent the diffusive flux of $O_2$ in the medium surrounding the microwell. FIG. 8e is a plot of the fraction f of the volume of the microwell where the $O_2$ concentration is larger than the threshold concentration $C_{cr}$ (0.1 µM) required for viable β-TC-6 cells versus the porosity of each face. The three panels correspond to cylindrical microwells with heights (or diameters) of 500, 250 and 100 µm. The regions shown in solid (3D microwell) and hatched (2D microwell) are bounded by low and high literature values of consumption rates (J. L. Dulong and C. Legallais, Biotechnol. Bioeng., 2007, 96, 990-998; P. Buchwald, Theor. Biol. Med. Modell., 2009, 6, 5). FIG. 8f is a plot of f versus both the cell density and $O_2$ consumption rate within a microwell with a height (or diameter) of 500 µm and wall porosity φ=2.3%. The intersection of the dotted line in the plot corresponds to the parameters used in determining the spatial variation of viable cells shown in FIGS. 8c and 8d.

FIG. 10a is an optical image of a 65 µm thick SU-8 holder with recessed slots and a 3×3 array of microwells positioned with their open faces oriented upwards according to an embodiment of the current invention. Optical images of ordered 3D microwell arrays on both FIG. 10b flat and FIG. 10c curved surfaces. The number 3 and letter D are spelt out to highlight versatility in the spacing and positioning offered by this arraying technique. All scale bars are 500 µm.

FIG. 11a shows insulin response profiles to a glucose stimulation from one, three and five porous-faced microwell arrays after seven days according to an embodiment of the current invention. Data are plotted as the average±the standard deviation (sample size n=5). FIG. 11b is a graph showing the four hour (steady-state) insulin concentration measured in response to a glucose stimulation for b-TC-6 cells encapsulated within 2D (one porous-faced), three porous-faced and 3D (five porous-faced) microwell arrays. The average and the standard deviation obtained on days 1

Figures 2A, 2B, 2C, 2D, 2E:
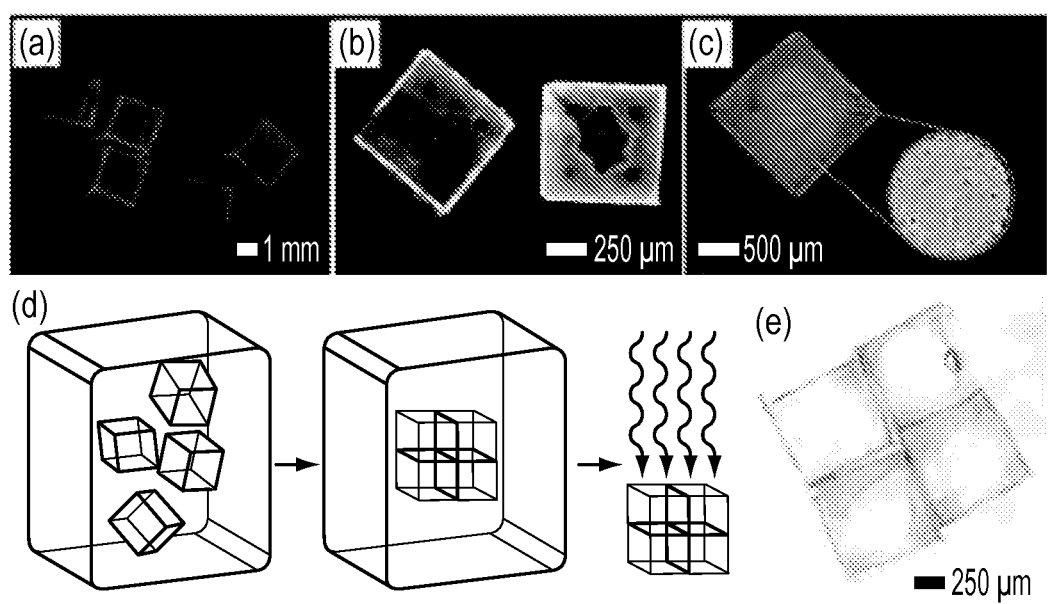
FIGS. 2a-2e demonstrate the versatility and 3D self-assembly of multiple containers according to some embodiments of the current invention.
Figures 3A, 3B, 3C, 3D, 3E, 3F:
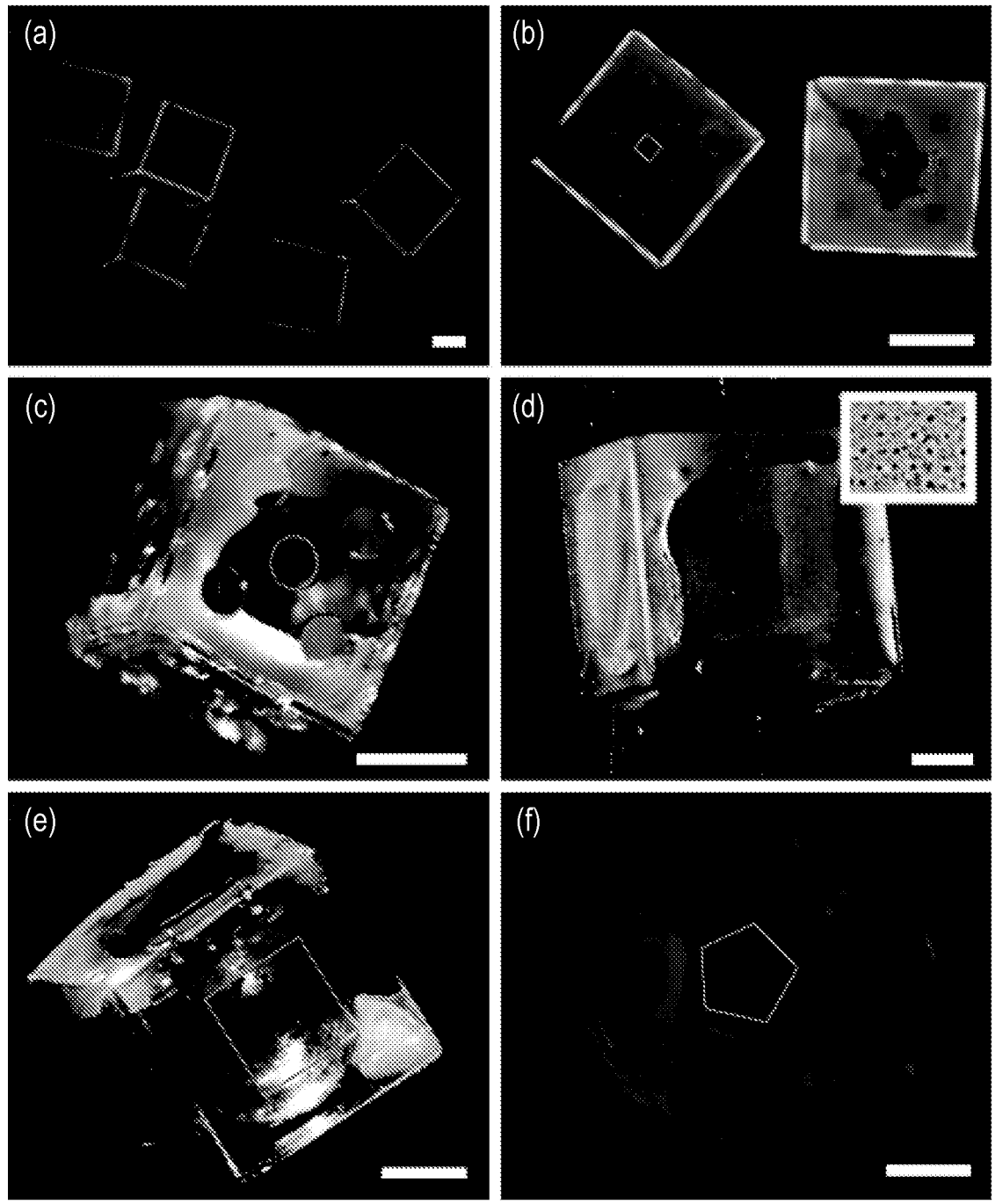
FIGS. 3a-3f show some examples of self-folding of multiple containers and versatility in polyhedral shape, size and precise porosity in all three dimensions according to some embodiments of the current invention. The lithographically patterned pores are outlined on the images and the scale bar is 250 µm long.

(number of samples, n=5), 7 (n=5), 14 (n=3) and 28 (n=3) are plotted. The 3D microwell arrays produced significantly greater stimulated insulin at longer times. Representative fluorescence images of 2D FIG. 11c and 3D FIG. 11d 500 µm sized microwells removed from the array after 7 days. Cells were stained using the Live/Dead (green/red) assay. Microwells with one porous face showed significant numbers of dead cells while those with five porous faces showed high cell viability (scale bar 200 µm).

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

In numerous lab-on-a-chip applications where a small device size is desirable while retaining high perfusion with the surrounding medium, there is a need to transition to the third dimension. For example, to increase diffusion of media in cell culture devices, researchers have developed microfabricated chemostats with porous side walls, see A. Groisman, et al., *Nat. Methods* 2:685-689 (2005), partitioned microfluidic channels, see A. P. Wong, et al., *Biomaterials* 29:1853-1861 (2008), and microgel-based building blocks. See Y. Du, et al., *Proc. Nat. Acad. Sci. USA* 105:9522-9527 (2008). As compared to gel-based systems where porosity is a consequence of crosslinking and can have considerable spatial variability, lithographic patterning of pores offers the possibility for high precision and reproducibility. See T. A. Desai, et al., *Biotechnol. Bioeng.* 57:118-120 (1998). Although lithographic approaches have been successfully applied to microfabricated containers, in most cases, however, they feature porosity in inherently two-dimensional (2D) geometries, which allow diffusion only from the top and bottom faces. See J. Kwon, et al., *J. Vac. Sci. Technol., B*, 27:2795-2800 (2009); S. L. Tao, et al., *Nat. Protocols* 1:3153-3158 (2007).

According to some embodiments of the current invention, self-folding micro-containers can be fabricated with all-polymeric compositions and can be used to encapsulate beads, chemicals, live cells and microorganisms, for example. Containers according to some embodiments of the current invention can be optically transparent, which facilitates easy viewing of encapsulated cells and organisms. They can also be comprised of materials commonly used in bioMEMS and drug delivery, including, but not limited to, SU-8 panels and biodegradable poly (ε-caprolactone) (PCL) hinges.

SU-8 is a biocompatible, photosensitive and mechanically stable epoxy-based polymer that is commonly used to fabricate microfluidic, see P. J. Hung, et al., *Lab Chip* 5:44-48 (2005), and drug delivery devices. See S. L. Tao, et al., *Nat. Protocols* 1:3153-3158 (2007). PCL is biocompatible and has adequate mechanical strength, which allows for its use in a range of biomedical microdevices. See D. K. Armani, C. Liu, *J. Micromech. Microeng.* 10:80-84 (2000); A. G. A Coombes, et al., *Biomaterials* 25:315-325 (2004); B. W. Tillman, et al., *Biomaterials* 30:583-588 (2009). PCL also is a biodegradable polymer, so that when it is used as a hinge material in a larger device, biodegradation can cause the device to come apart over time. This concept of self-disintegration has been explored previously in biomedical devices, specifically in the M2A patency capsule, see A. J. Postgate, et al., *Dig. Dis. Sci.* 53:2732-2738 (2008), a self-disintegrating wireless, video capsule based swallowable device, which is held together by paraffin plugs that typically begin to dissolve after 30 hours following ingestion. The capsule's self-disintegration causes it to be more easily excreted after it has achieved its function. However, the broad concepts of the current invention are not limited to these particular examples.

FIG. 1a is a schematic illustration of a sub-centimeter structure 100, and methods of producing the sub-centimeter structure 100, according to some embodiments of the current invention. The sub-centimeter structure 100 has a first structural component 102, a second structural component 104 arranged proximate the first structural component 102, and a joint 106 connecting the first and second structural components 102, 104. The joint 106 is a material that has a first phase that is substantially rigid to hold the first and second structural components 102, 104 in a substantially rigid configuration while the material of the joint 106 is in the first phase. The material of the joint 106 has a second phase such that the joint 106 is at least partially fluid to allow the first and second structural components 102, 104 to move relative to each other while the material is in the second phase. The joint 106 interacts with the first and second structural components 102, 104 while the material is in the second phase to cause the first and second structural components 102, 104 to move relative to each other.

In the example of FIG. 1a, the structural components 102 and 104 are formed on a substrate 108, for example by a lithographic process. However, the broad concepts of the current invention are not limited to only providing the structural components by lithographic processes. In this example, there is a sacrificial layer of material 110 between the structural components 102, 104 and the substrate 108. In this example, once the structural components 102 and 104 are provided and a joint 106 connects the structural components 102 and 104, the substantially two-dimensional structure can be "lifted off" the substrate by at least partially removing the sacrificial layer. The sacrificial layer can be dissolved or made to undergo a phase change such as melting, for example. In this example, after the structure is lifted off the substrate, the joint 106 is exposed to heat such that it at least partially melts. In this example, the surface tension of the material of the joint 106 causes the structural components 102 and 104 to move relative to each other due to the "beading up" of the material of the joint more on one side of the structure 100 than the other. Consequently, the sub-centimeter structure "self-assembles" into an L-shaped structure in this example.

The term "self assemble" is being used to distinguish from the case in which each structural component is individually positioned into the final configuration. According to an embodiment of the current invention, many structures can self-assemble in parallel by subjecting them all to heat at the same time. Thus they self assemble once the proper environmental conditions, such as temperature, are realized. When the sub-centimeter structure 100 self-assembles, it can be cooled such that the joint 106 again becomes rigid to hold the sub-centimeter structure rigidly together. The joint 106 is sometimes referred to as a hinge. The term hinge is not to be construed as always allowing movement of the structural components. Similarly, the term "joint" is intended to cover both a rigid joint, or a joint that compels movement of structural components. The term joint as used herein is intended to include the term hinge.

The structure is referred to as a sub-centimeter structure since there may be some applications in which relatively large structures, up to about 1 cm for example, may be desired. However, in other cases it may be desirable for the structure to be a sub-millimeter structure, or even a sub-micron structure.

One can imagine that an unlimited number of particular structures can be built up with pluralities of structural components arranged in various ways with pluralities of joints between adjacent structural components. According to some embodiments of the current invention, a plurality of structural components and a plurality of joints can be arranged such that the sub-centimeter structure is an enclosing structure in a configuration. FIG. 1b is a schematic illustration of example of a sub-centimeter structure 200 that is an enclosing structure according to an embodiment of the current invention. The sub-centimeter structure 200 is cube-shaped "box" which can function as a container in some applications. The sub-centimeter structure 200 has six structural components 202-212 and five joints 214-222. Also, pairs of edges, such as edge 224 and 226 can include material which will result in the overlapping edges (e.g., 224 with 226) to become joined or fastened together. In some embodiments, the edges, such as edges 224 and 226, can be the same material as the joints 214-222. However, different materials and different locking structures can be used according to other embodiments of the current invention. In some embodiments, the structural components, such as structural components 202-212, will be referred to as panels. However, the structural components are not limited to only "panel-like" structural components.

FIG. 1c shows images of an actual sub-centimeter structure corresponding to the schematic illustration of FIG. 1b. In this example, the fabrication process included three steps. Briefly, in the first two steps, 2D templates comprising SU-8 square panels connected by PCL hinges were patterned using a combination of photolithography and lift-off deposition on a poly(vinyl alcohol) (PVA) sacrificial layer. Any polymeric or gel-based material can be used in place of SU-8 for the panels provided the polymeric or gel-based material: (a) is patternable; (b) is sufficiently rigid so as not to collapse during folding; and (c) an appropriate sacrificial layer that provides dissolution selectivity can be found.

PCL hinges were deposited in alignment with the SU-8 panels. For the hinge material, there was the additional constraint that the material can be liquefied at a low temperature; for example, PCL softens at 50° C. and has a melting point of 58° C. The 2D SU-8 panels interconnected with PCL hinges were then released from the substrate by dissolution of the PVA sacrificial layer in water. The 2D templates spontaneously folded into three-dimensional (3D) cubes in water, PBS solution and cell media upon heating above 50° C. In principle, using the presently disclosed methods and materials, any microscale, three-dimensional, polyhedral structure having precisely patterned faces can be constructed. However, the broad concepts of the current invention are not limited to only polyhedral structures. In representative, non-limiting embodiments, such as the example of FIG. 1c, the panels are square. One of ordinary skill in the art upon review of the presently disclosed subject matter would recognize that panels having other geometries are suitable for use with the presently disclosed methods and materials. The example of FIG. 1c is a microstructure as can be seen by the scale of reference. Also, each panel in the example of FIG. 1c has a window-like through hole to permit the flow of fluids and small particles therethrough. These will also be referred to as pores.

Further, the presently disclosed sub-centimeter structures can have, but are not limited to, any polyhedral shape. As used herein, the term "polyhedral" refers to of or relating to, or resembling a polyhedron. The term "polyhedron" refers to a three-dimensional object bounded by plane polygons or faces. The term "polygon" refers to a multisided geometric figure that is bound by many straight lines, including, but not limited to, a triangle, a square, a pentagon, a hexagon, a heptagon, an octagon, and the like. For example, the presently disclosed sub-centimeter structures, in some embodiments, can be a cube. A cube is a three-dimensional object bounded by six square faces or sides, with three sides meeting at each vertex, i.e., a corner.

One of ordinary skill in the art also would appreciate that the presently disclosed sub-centimeter structures also can be fabricated on the nanoscale, e.g., having a dimension from about 1 nm to about 999 nm. In some embodiments the sub-centimeter structure is an enclosing structure in a configuration that has a maximum dimension of at least 10 nm and less than 10 mm. In further embodiments the sub-centimeter structure is an enclosing structure in a configuration that has a maximum dimension of at least 10 nm and less than 1 mm. In still further embodiments the sub-centimeter structure is an enclosing structure in a configuration that has a maximum dimension of at least 10 nm and less than 1 µm.

In illustrative embodiments, self-folding occurred within a one-minute time frame (see FIGS. 1b-1c). The self-folding phenomenon is thought to be driven by a minimization of surface tension of the liquefying PCL hinges. However, the invention is not limited by any particular theory. At temperatures exceeding 50° C., the solid PCL in the hinge gaps transitioned from a white, opaque solid state to a transparent softened state, and the panels rotated upwards as a result of a torque generated by the phase change (FIG. 1c). In representative embodiments, the presently disclosed hinge design used external "locking" hinges bordering the 2D panels (shade grey in FIG. 1b, e.g., 224 and 226), which is thought to play an important role in achieving self-correction in the container's faces to yield a well-formed cube structure during the self-folding step of the fabrication process.

Under circumstances in which the hinge gap had a high volume of PCL, any excess was retained within the container and reduced the encapsulation volume. As compared to self-folding metallic containers, a greater degree of self-correction was observed during self-folding of the presently disclosed containers due to the mechanical flexibility of the SU-8 panels. The hinges exhibited considerable reflow when heat was applied until the container reached a state of lowest free energy. Faces were observed to self-correct by about 10 degrees to about 15 degrees after making orthogonal contact with adjacent faces until the distribution of molten PCL in the edges of the microcontainers equalized in a low-energy state. Upon cooling, the PCL solidified and the cubes were sealed. An advantage of the presently disclosed self-folding process is that it provides for parallel fabrication of a plurality of containers, although yields vary depending on the method use for depositing and patterning the hinges.

In other embodiments, in addition to cubic containers, larger structures for scaffolding applications also can self assemble (see FIGS. 2d-2e). In such embodiments, a plurality, for example, four, polymeric microcontainers were functionalized with a hydrophobic adhesive as described in previous studies. See J. Tien, et al., *J. Am. Chem. Soc.* 120:12670-12671 (1998); Z. Y. Gu, et al., *Langmuir* 20:11308-11311 (2004). The microcontainers were placed in a vial of water and shaken gently to form aggregates based on the surface energy minimization of the exposed hydrophobic area. These structures were then fixed in place by curing the adhesive using ultraviolet light. An advantage of the presently disclosed process according to an embodiment of the current invention is the ability to pattern a wide range of porosities with a high level of control within individual units and thereby precisely engineer the porosity of the overall scaffold.

The presently disclosed fabrication process is versatile and the overall container sizes, as well as pore shape (e.g., square or round), size (e.g., about 8 μm to about 500 μm) and density (e.g., about 0% to about 50%) on one or all faces (FIGS. 3a-3f) can be varied. One feature of the presently disclosed self-folding process is that it allows container side wall porosity to be precisely patterned in 2D onto the SU-8 panels. Porosity and repeating pore patterns can be readily manipulated when designing photolithography masks, using, for example, Autodesk AutoCAD. Accordingly, the shape and size of pores are thus limited only by the 2D patterning resolution and aspect ratio.

Figures 4A, 4B, 4C, 4D, 4E, 4F:
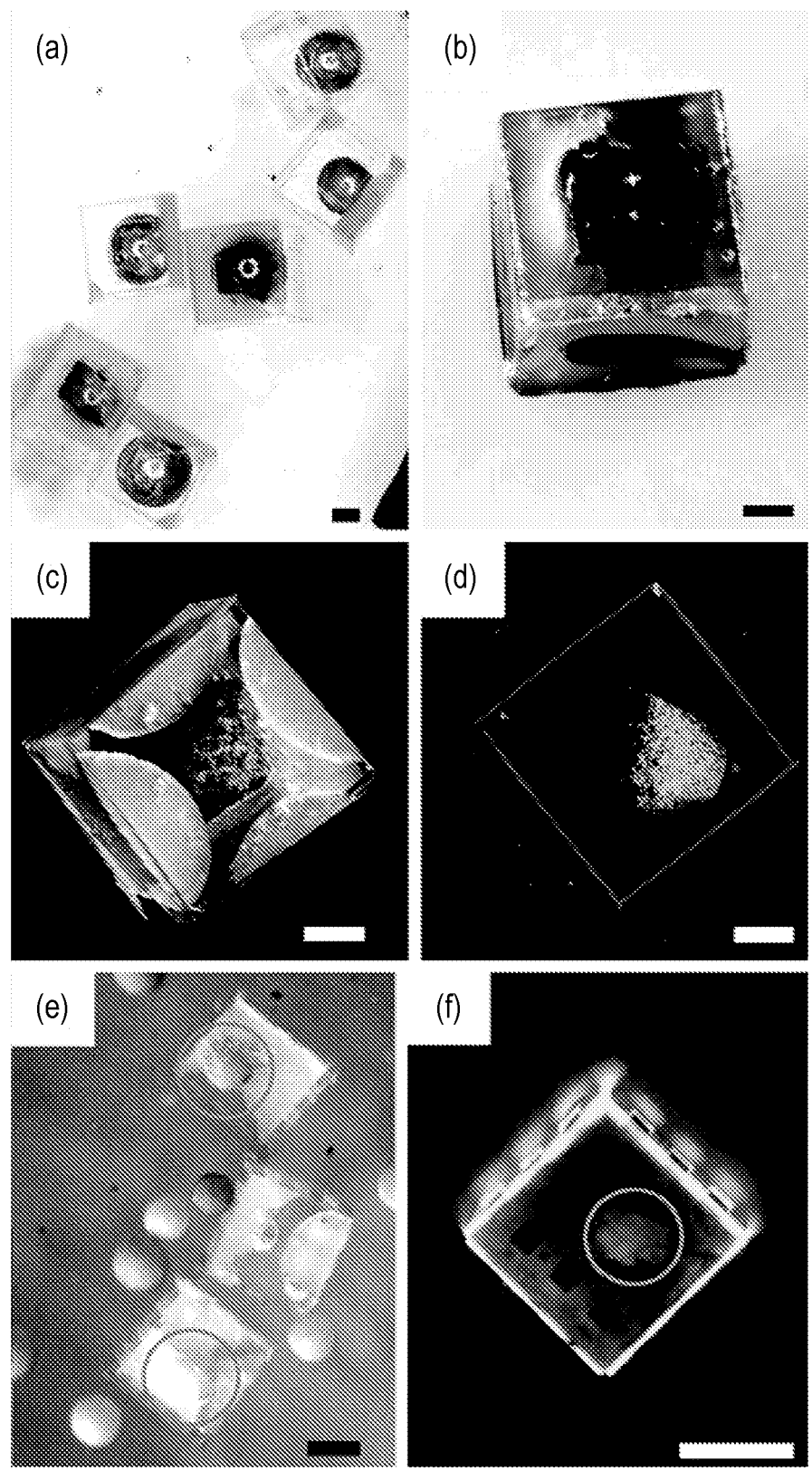
FIGS. 4a-4f show examples of encapsulation of beads, chemicals, cells and Artemia eggs according to an embodiment of the current invention. The scale bar is 250 µm long.
Figures 5A, 5B, 5C, 5D:
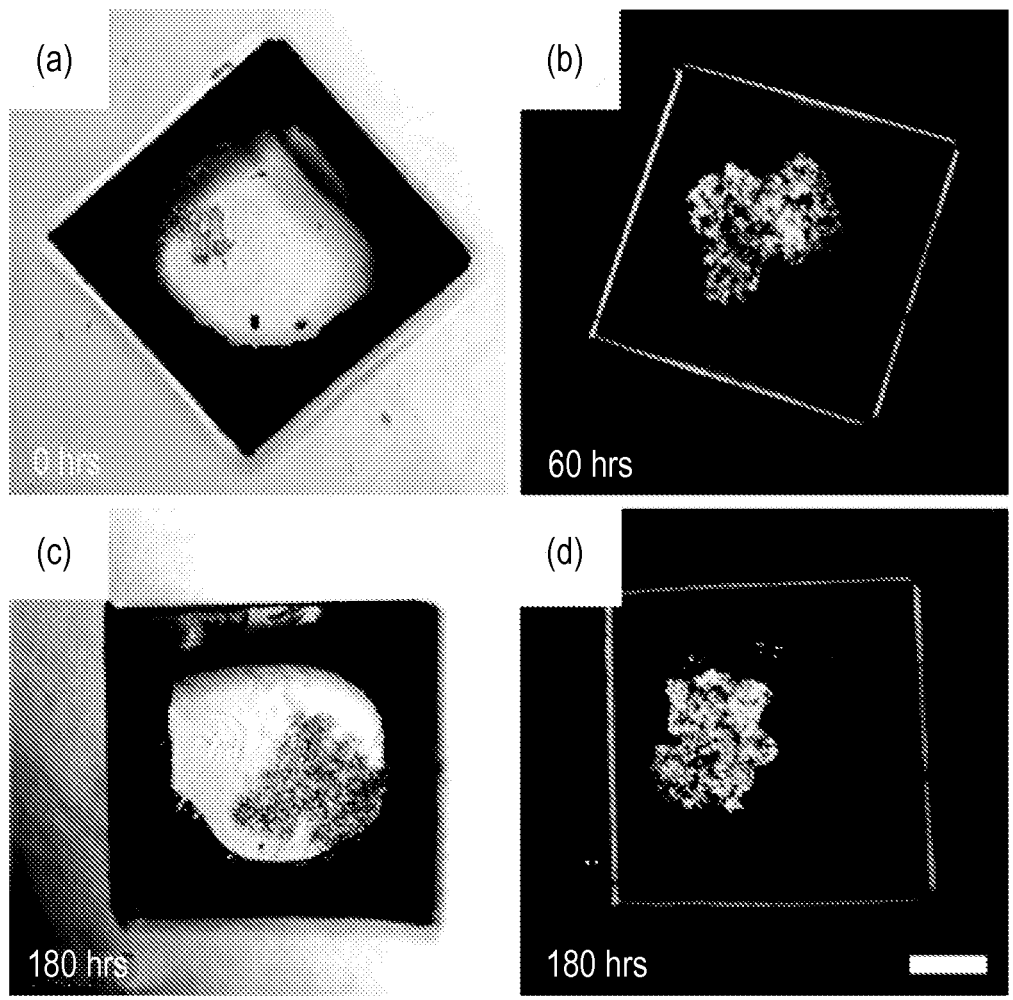
FIGS. 5a-5d shows multi-day time-lapse images of pancreatic cells encapsulated in a polymer container according to an embodiment of the current invention. The scale bar is 250 µm long.
Figures 6A, 6B:
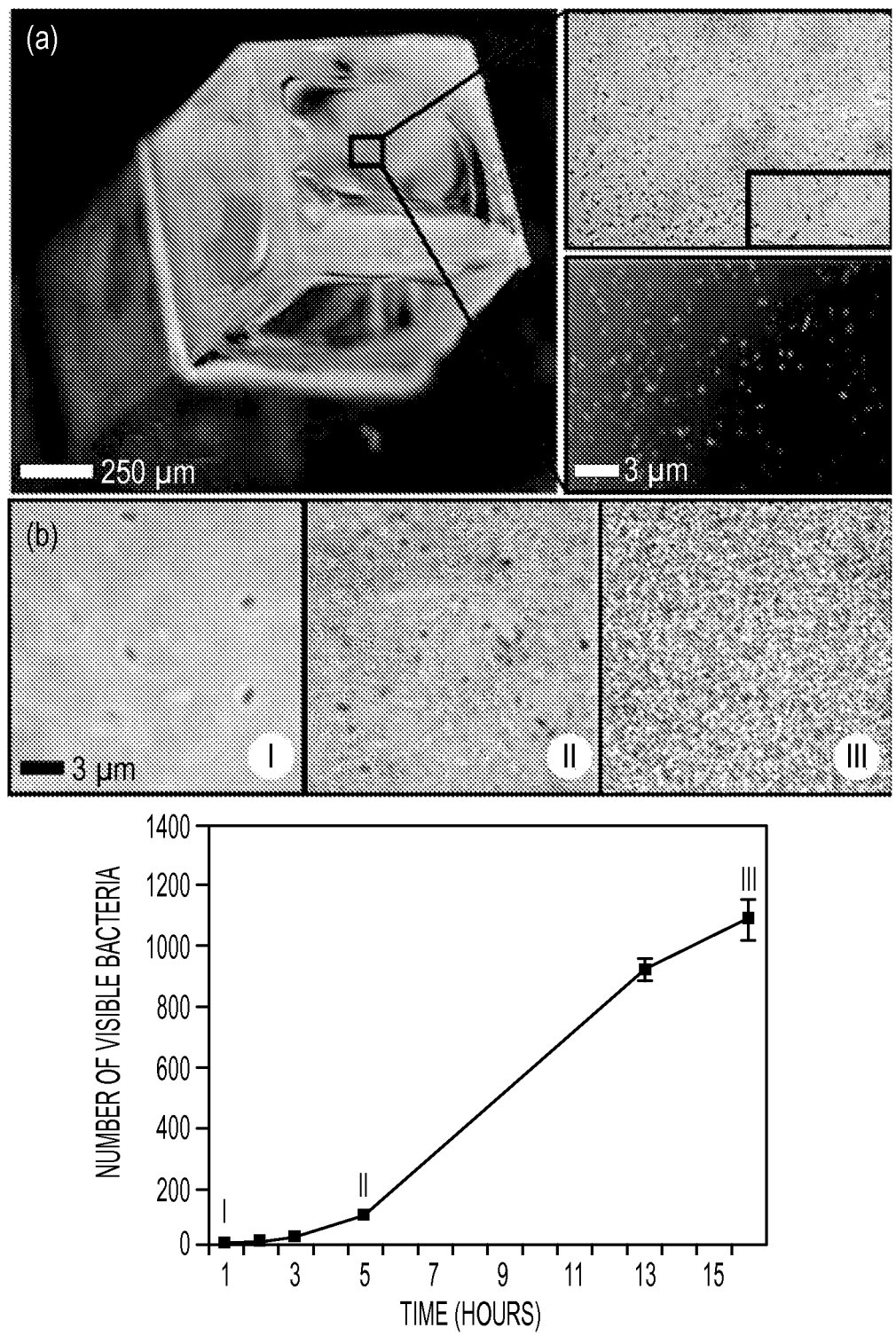
FIGS. 6a and 6b is an example of bacterial encapsulation and culture according to an embodiment of the current invention.

To demonstrate the use of the presently disclosed containers as encapsulants for a wide range of microfluidic and biomedical applications, representative containers were loaded with beads (FIG. 4a), chemical dyes (FIG. 4b), fibroblast cells (FIGS. 4c-4d), brine shrimp (*Anemia salina*) eggs (FIGS. 4e-4f), pancreatic cells (FIGS. 5a-5d) and bacteria (FIGS. 6a-6b) (*E-coli*) (see also, A. Anum, et al, Biomed Microdevices (2011) 13:51-58, the entire contents of which are incorporated herein by reference). Containers could be self-loaded by assembling them in the presence of cargo in a manner similar to loading vesicles or liposomes. See A. Fritze, et al., *Biochim. Biophys. Acta—Biomembranes* 1758:1633-1640 (2006); T. G. Leong, et al., *Lab Chip* 8:1621-1625 (2008).

In experiments with PCL hinged containers, however, self-loading required heating above 50° C., which is lethal for many kinds of cells. Accordingly, for live cell loading, folded containers with small (approximately 5-pm to 10-pm wide) gaps within the hinges were tumbled in media with a high cell concentration. Cells entered the container through the gaps and live cells could be imaged within the container (FIGS. 5a-5d).

Further, one feature of the presently disclosed containers is their optical transparency, which allows imaging of encapsulated contents using both bright field and fluorescence imaging. Cells could be imaged in a non-invasive manner. Polymeric containers of varying sizes with encapsulated microbeads, cells, eggs, and dyes were imaged using optical microscopy (FIGS. 4a-4f), without damage to the contents of the containers.

Porosity in all three dimensions of the presently disclosed containers allows enhanced diffusion with the surrounding media. Further, the presently disclosed containers are mechanically stable, which allows them to withstand being transported by pipettes to different dishes or solutions. Their conduciveness to forming arrays by self-assembly methods augments recent research that has focused on the development of disposable, miniaturized multi-well growth chips for microorganism culture, high-throughput screening and building bacterial communities. See C. J. Ingham, et al., *Proc. Natl. Acad. Sci. USA*, 104:18217-18222 (2007); D. B. Weibel, *Proc. Natl. Acad. Sci. USA*, 105:18075-18076 (2008). To this end, the presently disclosed containers resemble miniaturized micro-Petri dishes or multi-well plates with enhanced 3D diffusion and the potential for in situ imaging of encapsulated contents. Dye loaded containers can either be uncoated or further coated with nanoporous gels, such as gelatin, to slow down the rate of dye release. Depending on the porosity of the containers and the type of coating used, it would be possible to tune chemical release over a wide time scale. The use of PCL as hinges also offers the possibility for biodegradability and long-term release of encapsulated contents. PCL is known to be biodegradable via hydrolysis of its ester linkages and by enzymes, see G. E. Wnek, G. L. Bowlin, *Encyclopedia of Biomaterials and Bioengineering*, Informa Healthcare, London, UK, 2nd ed., 2008, vol. 1, pp. 8-31; hydrolytic degradation is accelerated at high or low pH.

Figure 7:
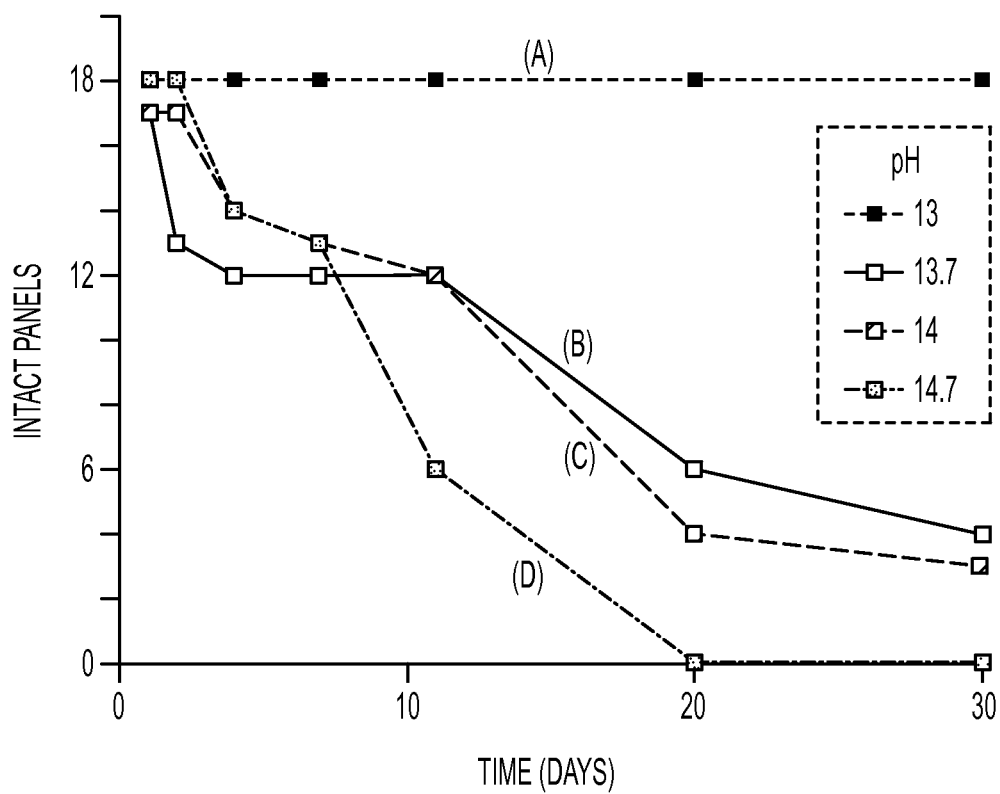
FIG. 7 is a plot of the PCL hinge degradation rates at different pHs

In representative embodiments, biodegradation of the presently disclosed containers in PBS-based media was monitored using an accelerated test with variable high pH (FIG. 7). The presently disclosed results are in agreement with published literature in that containers degrade faster in more alkaline media. See C. X. F. Lam, et al., *Biomed. Mater.*, 3:034108-22 (2008); J. Pefia, et al., *I Biomed. Mater. Res.* 76A:788-797 (2006). The presently disclosed hinges, however, degraded more rapidly (on the order of 30 days for pH>13) as compared to published data. This faster degradation rate can be attributed to a much smaller volume of PCL within the hinges. However, the current invention is not limited to whether or not this theory is correct. Nevertheless, the utility of PCL hinges within the containers demonstrate the applicability of constructing a self-disintegrating encapsulant.

Numerous studies have shown that PCL degradation can be carefully timed and controlled through its copolymerization with other biocompatible materials, such as collagen and chitosan. See B. W. Tillman, et al., *Biomaterials* 30:583-588 (2009); G. E. Wnek, G. L. Bowlin, *Encyclopedia of Biomaterials and Bioengineering*, Informa Healthcare, London, UK, 2nd edn, 2008, vol. 1, pp. 8-31; Y. Wan, et al., *Polym. Degrad. Stab.* 93:1736-1741 (2008). This copolymerization strategy can be utilized to precisely engineer the kinetics of hinge degradation.

In summary, some embodiments of the current invention can provide an effective strategy for fabricating patternable, self-folding all-polymeric microcontainers for a variety of biological applications. The self-folding strategy is unique with regard to its capability to enable micro-patterning in 3D, as well as 2D. This feature, despite its considerable value for porous membrane-based encapsulants, is not readily achievable using other methodologies. The presently disclosed containers according to some embodiments of the current invention can be used to monitor the behavior of cells and microorganisms in 3D environments using optical microscopy.

Some embodiments of the current invention can also provide biodegradable, lithographically patterned, particles for in vivo drug delivery. In the arena of targeted drug delivery, precise porosity in all three dimensions would enable drug delivery with exceptional spatio-temporal control. The most significant challenge in the creation of smaller polymeric containers for drug delivery applications using self-folding strategies, however, is enabling high resolution sub-micron scale patterning of the 2D polymeric templates. Previously published theoretical, see T. G. Leong, et al., *Langmuir* 23:8747-8751 (2007), and experimental, J. H. Cho, D. H. Gracias, *Nanolett.* 9:4049-4052 (2009), studies indicate that if these 2D templates could be patterned, even 100-nm scale containers would self-fold to yield viable drug delivery solutions.

Further, in some embodiments, the three-dimensional polyhedron formed by self assembly of the plurality of two-dimensional panels is hollow. Accordingly, such structures have a fillable center chamber of microscale proportions and can be used as a container, biocontainer, or microscale encapsulant. As used herein, the terms "container," "biocontainer," and "microscale encapsulant" refer to a three-dimensional object, i.e., a receptacle, having a hollow interior or an interior capable of containing substances.

In some embodiments, after self-assembly, the fillable center chamber of the presently disclosed microstructures is available as a vessel for encapsulation of materials or substances, including, but not limited to, drugs or other therapeutic agents, biological media, including cells and tissues, gels, and polymers, including natural or synthetic polymers, such as proteins (polymer of amino acids) and cellulose (polymer of sugar molecules), which subsequently can be released in situ. See, e.g., U.S. Patent Application Nos. US2007/0020310 A1, published Jan. 25, 2007, and US2009/0311190 A1, published Dec. 17, 2009, each of which is incorporated herein by reference in its entirety.

Accordingly, in some embodiments, the presently disclosed subject matter further provides a method of encapsulating a material or substance in a three-dimensional microstructure comprising a plurality of two-dimensional panels that self-assemble to form a hollow polyhedral shape and a fillable center chamber, the method comprising: (i) loading the fillable center chamber of the microstructure with at least one substance to form a loaded microstructure; and (ii) administering the loaded microstructure to a subject. In another embodiment, the microstructure comprises perforations or pores in the two-dimensional panels of the microstructure, which allow release of the substance in the fillable center chamber. In some embodiments, the at least one substance of step (i) is a therapeutic agent. In embodiments, the therapeutic agent is selected from the group consisting of a cell, a pharmaceutical agent, a composition, a tissue, a gel, and a polymer.

Such materials or substances can be contained within, loaded into, or otherwise associated with, e.g., directly bound, adhered, or attached through a linker to, the microstructure. The materials or substances can subsequently be released from the microstructure. In some embodiments, the release can be a slow or time-elapsed release to provide a pre-determined amount of the material or substance to a subject over a period of time. Such embodiments include both in vitro and in vivo applications. Accordingly, materials or substances encapsulated by the presently disclosed microstructures can be delivered to a specific target or generally administered to a subject. Thus, in some embodiments, the presently disclosed subject matter further provides a method for targeting a microstructure to a cell within a subject, the method comprising: (a) attaching to the microstructure an antibody against an antigen specific to the cell; and (b) administering the microstructure to the subject, wherein the microstructure is targeted to the cell.

In some embodiments, the presently disclosed 3D microstructures can be loaded with cells embedded in a gel. The term "gel" as used herein refers to an apparently solid, jellylike material formed from a colloidal solution. The term "colloid" or "colloidal" as used herein refers to a substance made up of a system of particles dispersed in a continuous medium. By weight, gels are mostly liquid, yet they behave like solids. The term "solution" refers to a homogeneous mixture of one or more substances (the solutes) dissolved in another substance (the solvent). The cells could be released by immersing the microstructure in an appropriate solvent.

In some embodiments, functional cells (e.g., pancreatic islet cells, neuronal PC12 cells) can be encapsulated for in vitro and in vivo release with or without immunosuppression. For example, the presently disclosed 3D microstructures can be used to encapsulate and deliver insulin secreting cells for implantation in patients afflicted with diabetes and for placing tumor innocula in animal models where constraining cells within a small region is necessary, and for delivering functional PC12 cells, for example, to model neuronal differentiation.

The presently disclosed subject matter also includes a method of treating a disease, condition, or disorder in a subject in need of treatment thereof, the method comprising administering to the subject at least one microstructure encapsulating a composition, wherein the composition is released through one or more pores within the microstructure into the subject in an amount sufficient to treat the condition.

In one embodiment of this method the condition is diabetes and the composition comprises one or more insulin-secreting cells.

As used herein, the term "therapeutic agent" refers to any pharmaceutical agent, composition, gene, protein cell, molecule, or substance that can be used to treat, control or prevent a disease, medical condition or disorder. The term "treat" or "treating" includes abrogating, substantially inhibiting, slowing or reversing the progression of a condition, substantially ameliorating clinical or symptoms of a condition, and substantially preventing the appearance of clinical or symptoms of a condition.

The amount of a therapeutic agent that results in a therapeutic or beneficial effect following its administration to a subject, including humans, is a "therapeutic amount" or "pharmaceutically effective amount." The therapeutic or beneficial effect can be curing, minimizing, preventing, or ameliorating a disease or disorder, or may have any other therapeutic or pharmaceutical beneficial effect.

The term "disease" or "disorder," as used herein, refers to an impairment of health or a condition of abnormal functioning. The term "syndrome," as used herein, refers to a pattern of symptoms indicative of some disease or condition. The term "injury," as used herein, refers to damage or harm to a structure or function of the body caused by an outside agent or force, which may be physical or chemical. The term "condition," as used herein, refers to a variety of health states and is meant to include disorders, diseases, or injuries caused by any underlying mechanism or disorder, and includes the promotion of healthy tissues and organs.

The presently disclosed subject matter further provides a method for imaging a microstructure that has been introduced into a subject, the method comprising imaging the microstructure using magnetic resonance imaging. Accordingly, in some embodiments, the presently disclosed microstructures can be administered to a subject and its location within the subject can be detected and non-invasively tracked using magnetic resonance imaging (MRI) or CAT scan (CT) and do not require the presence of a contrast agent. In some embodiments, the microstructure can be imaged with negative contrast relative to background or positive contrast relative to background.

The term "magnetic resonance imaging" or "MRI," refers to a noninvasive imaging technique that uses the interaction between radio frequency pulses, a strong magnetic field, and an subject to construct images in slices/planes from the nuclear magnetic resonance (NMR) signal obtained from the hydrogen atoms inside the subject. The principle behind all MRI is the resonance equation, $$v=\gamma B_0 \quad \text{(Equation 1)}$$

which shows that the resonance frequency v of a spin is proportional to the magnetic field $B_0$, it is experiencing, where y is the gyromagnetic ratio.

Accordingly, in some embodiments, the presently disclosed subject matter further provides a method of imaging a three-dimensional microstructure comprising a plurality of two-dimensional panels that self-assemble to form a hollow polyhedral shape and a fillable center chamber, the method comprising: (i) loading the fillable center chamber of the microstructure with at least one substance to form a loaded microstructure; (ii) administering the loaded microstructure to a subject; and (iii) noninvasively tracking the microstructure of step (ii) in the subject by magnetic resonance imaging. In another embodiment, cells within or proximal to targeted microstructures of the presently disclosed microstructures can be imaged by MRI to evaluate the efficacy of the implant and the condition of the encapsulated cells.

The presently disclosed subject matter also provides a method for delivering one or more microstructures to a subject, wherein the one or more microstructures is programmed to remotely release one or in more reagents at a particular time and a particular spatial location. In one embodiment of this method, the microstructure is remotely guided and imaged using MRI or CT. Also provided is a method for releasing a contrast agent from the microstructure or of providing contrast to allow MRI or CT imaging of its contents or of substances within its vicinity.

A method also is provided for conducting a non-invasive biopsy or microsurgery, the method comprising directing one or more microstructures to a site within a subject using remote means, allowing the microstructure to capture one or more substances from the site, and obtaining the substance from the particle.

In yet other embodiments, the microstructures can further comprise a radio frequency tag, wherein the substance may be released upon the microstructure's exposure to a preselected radio frequency. In a further embodiment of the presently disclosed microstructure, the substance can be released upon the microstructure's exposure to electromagnetic radiation, which can be triggered remotely. The electromagnetic radiation capable of triggering the release can range from about 1 KHz to about 1 Peta Hz. In a further embodiment, the substance can be released upon the microstructure's exposure to inductive heating. Such inductive heating can be triggered remotely.

In some embodiments, the presently disclosed microstructures also can comprise active electronic or semiconductor components including, but not limited to, transistors, sensors, actuators, light emitting diodes, photodiodes and solar cells. In yet other embodiments, the presently disclosed microstructures can be associated with a biosensor.

Further embodiments of the current invention are directed to arrays comprising a plurality of sub-centimeter structures (see also, C. Randall, et al, Lab Chip, 2011,11,127, the entire contents of which are incorporated herein by reference).

Since cells reside in 3D environments in vivo, it is necessary to develop platforms that enable the culture and study of aggregates of cells while providing adequate diffusion in all three dimensions. For example, cells have been suspended and cultured within gels (L. Kim, Y. C. Toh, J. Voldman and H. Yu, Lab Chip, 2007, 7, 681-694; S. Rhee, Exp. Mol. Med., 2009, 41, 858-865; D. R. Albrecht, G. H. Underhill, T. B. Wassermann, R. L. Sah and S. N. Bhatia, Nat. Methods, 2006, 3, 369-375; K. Bolt, Z. Upton, K. Schrobback, M. Ehrbar, J. A. Hubbell, M. P. Lutolf and S. C. Rizzi, Biomaterials, 2010, 31, 8454-8464) or on porous multilayered scaffolds (K. W. Lee, S. Wang, M. J. Yaszemski and L. Lu, Biomacromolecules, 2010, 11, 682-689; D. Gallegro-Perez, N. Higuita-Castro, S. Sharma, R. K. Reen, A. F. Palmer, K. J. Gooch, L. J. Lee, J. J. Lannutti and D. J. Hansford, Lab Chip, 2010, 10, 775-782; A. Khademhosseini, R. Langer, J. Borenstein and J. P. Vacanti, Proc. Natl. Acad. Sci. U. S. A., 2006, 103, 2480-2487). Attempts have also been made to integrate channels within these materials to enable vasculature reminiscent of perfusion in 3D (N. W. Choi, M. Cabodi, B. Held, J. P. Gleghorn, L. J. Bonassar and A. D. Stroock, Nat. Mater., 2007, 8, 908-915; L. M. Bellan, S. P. Singh, P. W. Henderson, T. J. Porri, H. G. Craighead and J. A. Spector, Soft Matter, 2009, 5, 1354-1357). However, many existing methodologies provide limited control over geometric positioning of cell clusters such as can be achieved in an array as well as a lack of precise tunability of nutrient and waste diffusion in all three dimensions.

Culturing cells within present-day microwell arrays allows precise geometric positioning of cell clusters in culture and is a well-established practice in drug discovery, microbiology, tissue engineering and biotechnology (M. Charnley, M. Textor, A. Khademhosseini and M. P. Lutolf, Integr. Biol., 2009, 1, 625-634; B. Ma, G. Zhang, J. Qin and B. Lin, Lab Chip, 2009, 9, 232-239; D. Holmes and S. Gawad, Methods Mol. Biol. (Totowa, N. J.), 2010, 583, 55-80). This approach has been widely utilized due to ease of device fabrication, high throughput loading and compatibility with optical microscopy techniques (B. H. Weigl, R. L. Bardell and C. R. Cabrera, Adv. Drug Delivery Rev., 2003, 55, 349-377; P. J. Hung, P. J. Lee, P. Sabounchi, R. Lin and L. P. Lee, Biotechnol. Bioeng., 2004, 89, 1-8). Additionally, 2D microwells enable cells to be encapsulated and cultured in liquid media without the need for a gel. However, since conventional microwells are embedded in a flat substrate they do not accurately mimic the natural cellular microenvironment due to a lack of 3D cues from the external media, thus generating physiologically compromised cells (R. C. Dutta and A. K. Dutta, Biotechnol. Adv., 2009, 27, 334-339). For example, due to limited access to the surrounding medium from only one opening (a single 2D interface) in traditional planar microwell arrays, hypoxic conditions resulting in decreased cell or tissue function have been reported (C. Rappaport, In Vitro Cell. Dev. Biol.: Anim., 2003, 39, 187-192; E. M. Metzen, J. Wolff, J. Fandrey and J. Jelkman, Respir. Physiol., 1995, 100, 101-110; J. Malda, T. J. Klein and Z. Upton, Tissue Eng., 2007, 13, 2153-2162). According to some embodiments of the current invention, we can extend the concept of a conventional microwell array (FIG. 8a) by creating arrays of microwells with externally exposed or porous sidewalls. As a result, the 3D microwell arrays allow for the encapsulated cells to interact with their surroundings in all three dimensions (FIG. 8b) while retaining several of the attractive features of 2D microwell arrays described above. A more quantitative understanding of the diffusion characteristics of these microwells and of expected differences in cell behavior in 2D and 3D can be observed from numerical simulations. We simulated microwell sizes of 100, 250 and 500 μm while systematically varying the face porosity. Here, we generated a model of $O_2$ consumption by encapsulated pancreatic β-cells. Our choice for simulating this cell line was motivated by its widespread use in diabetes therapy (E.

S. Avgoustiniatos and C. K. Colton, in Bioartical Organs—Science, Medicine, and Technology, ed. A. Prokop, D. Hunkeler and A. D. Cherrington, New York Acad Sciences, New York, 1997, pp. 145-167) and in research related to bioartificial pancreas development (J. L. Dulong and C. Legallais, Biotechnol. Bioeng., 2007, 96, 990-998; P. Buchwald, Theor. Biol. Med. Modell., 2009, 6, 5). The simulation parameters were chosen to correspond to experimental conditions while still remaining instructive. The individual 2D and 3D microwells were cylindrical in geometry and were placed in the bottom-center of the medium. Stationary solutions of the spatial variation of $O_2$ concentration were obtained by solving the diffusion equation with a reaction term, $$\frac{\partial c}{\partial t} + \nabla(-D\nabla c) = R.$$

Here, c is the $O_2$ concentration, D is the diffusion coefficient of $O_2$ in either the medium or through the cellular mass and R is the $O_2$ reaction rate per unit volume. For the boundary conditions, we assumed the $O_2$ concentration at the medium-air interface to be constant and equal to 0.2 mM (P. Buchwald, Theor. Biol. Med. Modell., 2009, 6, 5). The $O_2$ cellular consumption rate R for β-TC-6 cells was assumed to vary in accordance with Michaelis-Menten kinetics with a necrosis threshold step-function $\theta(c>c_{cr})$ such that, $$R = R_{max} \times \frac{c}{c + c_{mm}} \times \theta(c > c_{cr}).$$

Here, $c_{mm}$ is the Michaelis-Menten constant assumed to be 1.0 μM, $c_{cr}$ is the critical necrosis threshold (0.1 μM) and $R_{max}$ is the maximal consumption rate. Two values for $R_{max}$ often cited in the literature of 16 μMs$^{-1}$ and 34 μMs$^{-1}$ were used to generate upper and lower bounds of the viability fraction (f) plots. We used the step function, $$\theta(c > c_{cr}) = \begin{cases} 1, & \text{if } (c > c_{cr}) \\ 0, & \text{if } (c < c_{cr}) \end{cases}$$

so that cells were alive when the $O_2$ concentration was above $c_{cr}$ and consumed $O_2$ or they were dead when the $O_2$ concentration was below $c_{cr}$ and had consumed all of the available $O_2$.

Figures 8A, 8B, 8C, 8D, 8E, 8F:
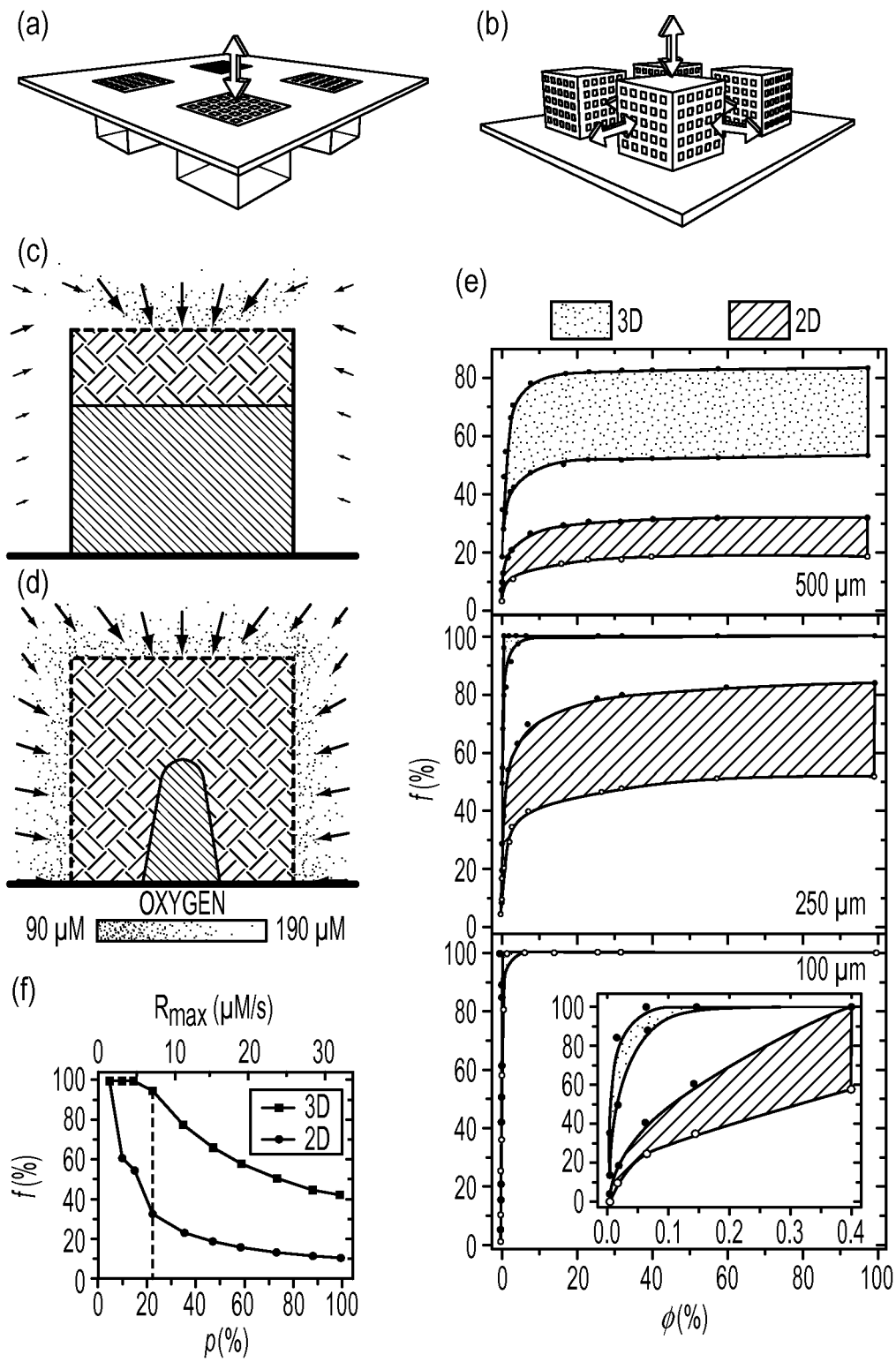
FIGS. 8a-8f illustrate some concepts of microarrays according to an embodiment of the current invention.

Simulations indicated that the fraction of viable cells depends upon the microwell volume, face porosity, encapsulated cell density and cellular $O_2$ consumption rate. Cell viability was observed to be consistently higher in microwells with 3D porosity as compared to 2D porosity (FIGS. 8c-8e). The spatial variation of viable cells within 2D and 3D microwells indicated that cells are more viable adjacent to porous faces (FIGS. 8c and 8d). This improvement was more pronounced in microwells with larger volumes and lower pore density. A notable simulation result is that cell viability was significantly higher when microwells feature 3D porosity and differences in viability as high as a factor of four were observed.

Since viability also depends on the number of cells encapsulated within the microwell, we simulated varying cell densities or cellular $O_2$ consumption within 500 μm sized microwells (FIG. 8f). The cell density (ρ) variation inside the microwells was modeled by varying the bulk $O_2$ consumption rate according to $$R = \rho \times R_{max} \times \frac{c}{c + c_{mm}} \times \theta(c > c_{cr}).$$

In the model, we assumed that all cells consume $O_2$ at the same rate and they have a close packed, uniform spatial distribution within the microwell. Simulations revealed that for all cell densities greater than approximately 5%, a significantly higher fraction of viable cells was consistently observed in 3D microwells.

Guided by numerical simulations and by the well-known fact that in vivo cells further than approximately 200 μm from the nearest blood vessel become hypoxic (R. H. Thomlinson and L. H. Gray, Br. J. Cancer, 1955, 9, 539-549), we chose 500 μm microwells to conduct a model experimental study. It should be noted that depending on the application (e.g. cell encapsulation therapy), the microwell size could be determined by a balance between encapsulating the largest numbers of cells for an improved therapeutic effect (by using larger wells) while providing adequate diffusion so that cells remain viable (by increasing surface to volume ratio achieved by using smaller wells). Many cell encapsulation devices such as alginate microspheres have diameters ranging from 400 to 800 μm (P. Devos, B. DeHaan, J. Pater and R. VanSchilfgaarde, Transplantation, 1996, 62, 893-899).

Figures 9A, 9B, 9C, 9D, 9E, 9F, 9G:
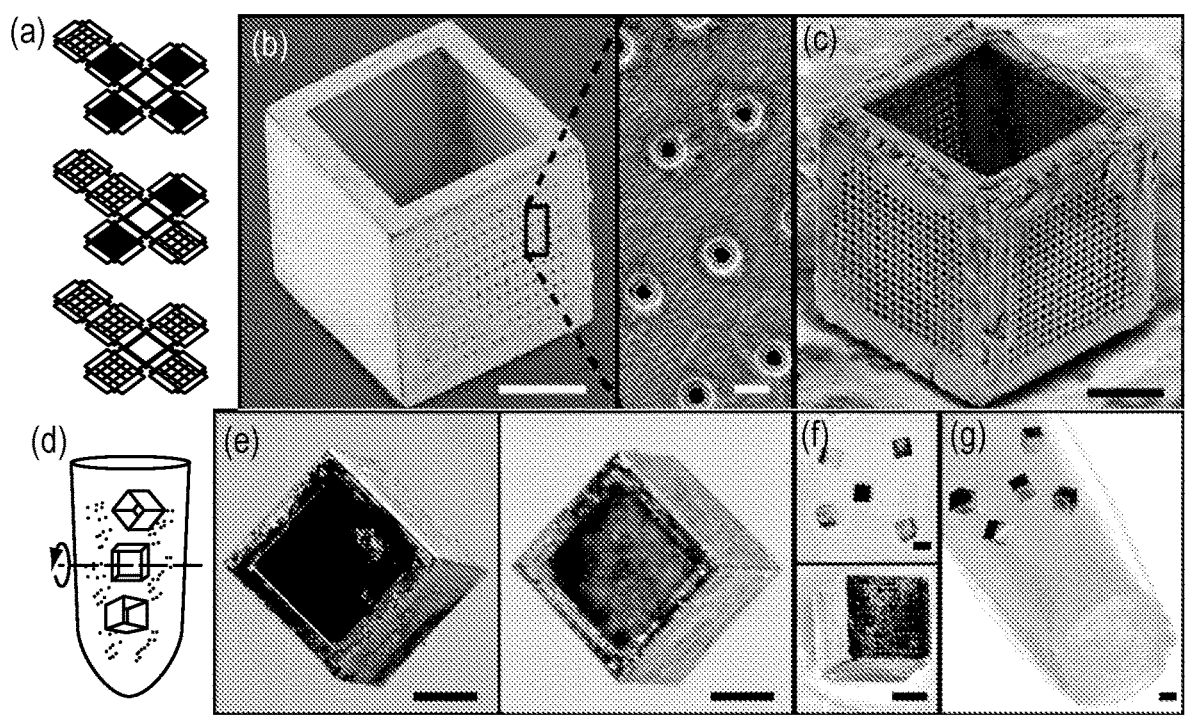
FIG. 9a is an example of layouts of the 2D templates for one, three and five porous-faced microwells according to an embodiment of the current invention. In each case, one panel had a large opening for cell loading.
FIG. 9b is an electron microscopy image of a 2D (one porous-faced, which self-assembled from the 2D template at the top panel of FIG. 9a) microwell along with a zoomed-in image showing individual pores according to an embodiment of the current invention.
FIG. 9c is an electron microscopy image of a 3D (five porous-faced, which self-assembled from the 2D template at the bottom of panel of FIG. 9a) microwell according to an embodiment of the current invention. The scale bar for the microwell images and inset indicates lengths of 200 µm and 10 mm respectively.
FIG. 9d is a conceptual schematic diagram of the cell-loading process which involves tumbling the microwells in a concentrated $10^4$ cells ml$^{-1}$ solution according to an embodiment of the current invention.
FIG. 9e show representative optical microscopy images of stained cells loaded via tumbling illustrating microwells with low (left) and high (right) cell number (scale bar 200 µm).
FIG. 9f is an optical microscopy image of five microwells arrayed and sealed on a polyurethane adhesive (scale bar 500 µm) with an inset showing the seal around the base of an individual microwell (scale bar 200 µm) according to an embodiment of the current invention.
FIG. 9g shows an optical microscopy image of a microwell array formed on a curved flexible substrate (scale bar 500 µm) according to an embodiment of the current invention.

Individual microwells were self-assembled (B. Gimi, T. G. Leong, Z. Gu, M. Yang, D. Artemov, Z. M. Bhujwalla and D. H. Gracias, Biomed. Microdevices, 2005, 7, 341-345) from 2D cruciform shaped templates composed of hollow, porous or closed square panels interconnected with solder hinges (FIG. 9a). Self-assembly was driven by the minimization of surface area of the molten hinges and has been described in detail elsewhere (T. G. Leong, P. Lester, T. Koh, E. Call and D. H. Gracias, Langmuir, 2007, 23, 8747-8751). A variety of polyhedral shapes with side lengths ranging from 100 nm to 2 mm, pore sizes as small as tens of nanometers, and with metallic or polymeric composition have been synthesized using this approach (T. G. Leong, A. Zarafshar and D. H. Gracias, Small, 2010, 6, 792-806; C. L. Randall, T. G. Leong, N. Bassik and D. H. Gracias, Adv. Drug Delivery Rev., 2007, 59, 1547-1561; C. L. Randall, A. Gillespie, S. Singh, T. G. Leong and D. H. Gracias, Anal. Bioanal. Chem., 2009, 393, 1217-1224; A. Azam, K. Laflin, M. Jamal, R. Fernandes and D. H. Gracias, Biomed. Microdevices, 2010, DOI: 10.1007/s10544-010-9470-x). The fabrication process is highly parallel and large numbers of polyhedra can be fabricated in a cost-effective manner. Here, a model geometry was designed in which we systematically varied the number of porous faces of 500 μm sized, cubic microwells between one (FIG. 9b), three and five (FIG. 9c); one face was left open for cell loading. Diffusion in the cubic microwells with one porous face mimics that of conventional 2D microwells, which typically have openings in only one plane; five porous-faced cubic microwells represent our example embodiment of 3D microwells. In all cases, pores were photolithographically structured as 10×16 arrays with individual sizes of 8 μm as-fabricated and 6 to 7 μm after gold (Au) coating. Au was electrodeposited onto all surfaces of the microwells to improve biocompatibility, since Au has been demonstrated to be inert to cells (B. Merchant, Biologicals, 1998, 26, 49-59) and can also be readily functionalized using a variety of thiol coatings to further enhance biocompatibility (J. C. Love, L. A. Estroff, J. K. Kriebel, R. G. Nuzzo and G. M. Whitesides, Chem. Rev., 2005, 105, 1103-1170).

As an alternative to the loading of conventional planar arrays using pipettes, microwells were loaded in a parallel manner via tumbling (FIG. 9d). Images of stained cells obtained within microwells indicated that there was variability in the number of loaded cells (FIG. 9e) within each microwell. However, since cells continued to multiply after loading, microwells had relatively homogeneous numbers of cells after incubation for 48 hours prior to first use. Haemocytometer counts that were obtained by counting trypsinized cells within microwells suggested cell numbers of $4.1 \pm 1.1$ ($\times 10^4$) (average over a sample size, n=30) within each microwell after 48 hours.

Arrays were then formed by first orienting the microwells with their open face upwards using a glass pipette. The desired substrate, typically an adhesive tape or polyurethane adhesive spin-coated on a glass slide, was then brought into contact with the open face of multiple microwells to form the array. Sealing of the open microwell faces was complete when the polymer cured, typically within 30 minutes in cell media. Using this approach, arrays could easily be formed on both rigid (flat, FIG. 9f) and flexible (curved, FIG. 9g) geometries.

Figures 10A, 10B, 10C:
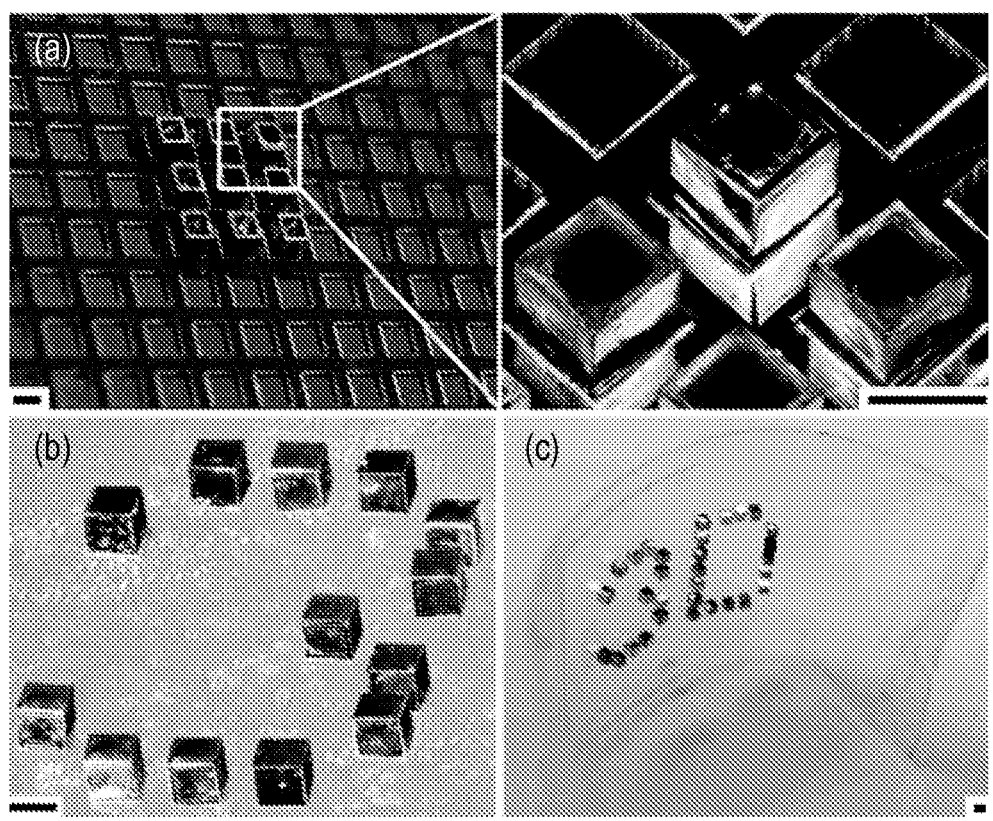
FIGS. 10a-10c show examples of arrays according to some embodiments of the current invention.

It was also possible to create arrays with both precisely positioned and spaced microwells by first positioning the microwells in an SU-8 holder that was patterned with recessed slots (FIG. 10a). In addition to loading microwells with cells prior to positioning, they could also be loaded after positioning in the holder by allowing the cells to settle into the microwells. The desired array substrate was then brought into contact with the spatially positioned microwells thus creating arrays with relatively well defined geometric spacing. The ordered array pattern "3D" on both a flat (FIG. 10b) and curved (FIG. 10c) substrate highlights the utility of this approach.

The relative functionality of β-TC-6 cells encapsulated within 2D versus 3D microwell arrays was assessed by measuring insulin release, as would be typically required in a therapeutically relevant device, over time periods ranging from one day to approximately one month. The insulin concentration was measured using an insulin enzyme-linked immunosorbent assay (ELISA) and was recorded from arrays composed of one, three or five porous faces. We observed a significant difference between the insulin release characteristics from 3D microwell arrays as compared to 2D microwell arrays. For example, the initial insulin release rate in response to glucose stimulation was significantly more rapid from 3D microwell arrays (FIG. 11a).

Additionally, over multiple trials, we found that while insulin release in response to the same glucose stimulation, at steady-state (240 minutes), from the one, three or five porous-faced microwell arrays was similar after encapsulation for one day, the 3D microwell arrays stimulated far greater insulin production after cells were encapsulated for longer durations (FIG. 11b). Specifically, after 28 days, the insulin released from five porous-faced microwell arrays was approximately $2.20 \pm 0.14$ ng ml$^{-1}$ as compared to $0.91 \pm 0.06$ ng ml$^{-1}$ for three porous-faced microwells. After 28 days, no measurable insulin was produced from 2D microwell arrays, while 3D microwell arrays maintained their insulin concentration levels.

In order to investigate the reason for the significantly enhanced insulin production by 3D microwell arrays as compared to 2D microwell arrays, we removed (peeled-off) individual microwells from the substrates at different time points and performed a Live/Dead cytotoxicity assay on the cells contained within. Starting from our 7 day measurement, we consistently observed significantly higher numbers of live cells within the 3D microwells as compared to the 2D microwells (FIGS. 11c and 11d). This result is in agreement with our simulations and provides an explanation for the insulin measurement results. We note that the numerical simulations presented in FIG. 8e are of microwells containing cells at higher cell densities in order to simulate the formation of a necrotic core. At similar cell densities that were used in the experiments (approx. 20%, corresponding to the dotted line in FIG. 8f and the corresponding image in FIG. 8d), minimal cell death was indeed predicted by simulations (<5%) as is consistent with the Live/Dead assayed 3D microwell arrays (FIG. 11d).

It should be noted that simulations only look at viability based on $O_2$ diffusion, but in reality cell viability is also dependent on other factors. For example, it is known that necrotic cells release chemicals that can impair the viability of proximal live cells, which could also contribute to the differences in observed cell viability over time between 2D and 3D porous-faced microwells. We hypothesize that this factor may also account for the continuously decreasing cell viability (and the corresponding decrease in insulin release) observed at long encapsulation times in 2D microwells (FIG. 11b).

In summary, both our simulations and experiments clearly indicate that 3D microwell arrays provide a significantly improved cell culture platform (in terms of enhanced diffusion and cell viability) as compared to widely utilized conventional 2D microwell arrays. In this example, we have focused on insulin secretion and cell viability based on nutrient diffusion. However, other aspects of individual cell behavior such as genetic expression or cellular morphology may also be altered when cells are cultured in more physiologically relevant 3D systems; these studies can be carried out using our 3D microwell arrays according to an embodiment of the current invention. As compared to other methods for culturing cells in geometries that enable 3D perfusion, our methodology affords high precision in terms of pore definition, size and spacing of cellular clusters. The 3D microwells enable cellular clusters to be precisely positioned on substrates in liquid culture media without the need for a gel matrix. If required, cells cultured in gel matrices can also be encapsulated. Additionally, fabrication of arrays that incorporate microwells with polymeric side walls would enable in situ viewing of encapsulated cells for in vitro cell culture applications. Our insulin release results indicate the therapeutic relevance of the 3D microwell array architecture for constructing bioartificial devices and for cell encapsulation therapy. For these in vivo applications, the ability to structure arrays of these microwells even on curved substrates could more accurately mimic anatomically relevant geometries.

The above examples describe some examples of arrays of sub-centimeter structures according to some embodiments of the current invention. However, the invention is not limited to those particular examples. A wide range of substrates or other supporting structures could be used as components of arrays according to some embodiments of the current invention.

Although specific terms are employed herein, they are used in a generic and descriptive sense only and not for purposes of limitation. Unless otherwise defined, all technical and scientific terms used herein have the same meaning as commonly understood by one of ordinary skill in the art to which this presently described subject matter belongs.

As used herein, the term "two-dimensional," which can be abbreviated as "2D," refers to a figure, an object, or an area that has a height and a width, but no depth, and is therefore flat or planar. In contrast, the term "three-dimensional," which can be abbreviated as "3D," refers to a figure, an object, or an area that has a height, a width, and a depth.

As used herein, the terms "microscale" or "microstructure" refer to one or more structures that have at least one dimension, e.g., a height, width, length, and/or depth, in a range from about one micrometer (μm), i.e., $1\times10^{-6}$ meters, to about 999 μm, including any integer value, and fractional values thereof, including about 1, 2, 5, 10, 20, 30, 40, 50, 60, 70, 80, 90, 100, 200, 500, 600, 700, 800, 900, 999 μm and the like.

As used herein, the terms "patterned" and "micropatterned," and grammatical variants thereof, are used interchangeably and refer to any arbitrary two-dimensional pattern having microscale features, i.e., features having at least one dimension, e.g., a height, width, length, and/or depth, in a range from about one um to about 999 um, as those ranges are defined herein below. In some embodiments, the two-dimensional pattern can have a sub-micrometer dimension, i.e., a dimension having a range from about 0.1 μm to about 0.999 μm.

The terms "photolithography," "photo-lithography," or "photolithographic process" refer to a lithographic technique in which precise patterns are created on a substrate, such as a metal or a resin, through the use of photographically-produced masks. Typically, a substrate is coated with a photoresist film, which is dried or hardened, and then exposed through irradiation by light, such as ultraviolet light, shining through the photomask. The unprotected areas then are removed, usually through etching, which leaves the desired patterns.

Following long-standing patent law convention, the terms "a," "an," and "the" refer to "one or more" when used in this application, including the claims. Thus, for example, reference to "a subject" includes a plurality of subjects, unless the context clearly is to the contrary (e.g., a plurality of subjects), and so forth. The term "plurality" as used herein means "one or more."

Throughout this specification and the claims, the terms "comprise," "comprises," and "comprising" are used in a non-exclusive sense, except where the context requires otherwise. Likewise, the term "include" and its grammatical variants are intended to be non-limiting, such that recitation of items in a list is not to the exclusion of other like items that can be substituted or added to the listed items.

For the purposes of this specification and appended claims, unless otherwise indicated, all numbers expressing amounts, sizes, dimensions, proportions, shapes, formulations, parameters, percentages, parameters, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some embodiments, ±100% in some embodiments ±50%, in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed methods or employ the disclosed compositions.

Further, the term "about" when used in connection with one or more numbers or numerical ranges, should be understood to refer to all such numbers, including all numbers in a range and modifies that range by extending the boundaries above and below the numerical values set forth. The recitation of numerical ranges by endpoints includes all numbers, e.g., whole integers, including fractions thereof, subsumed within that range (for example, the recitation of 1 to 5 includes 1, 2, 3, 4, and 5, as well as fractions thereof, e.g., 1.5, 2.25, 3.75, 4.1, and the like) and any range within that range.

The embodiments discussed in this specification are intended to explain concepts of the invention. However, the invention is not intended to be limited to the specific terminology selected and the particular examples described. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. A sub-centimeter and self-assembled structure, comprising:
   a plurality of structural components;
   a plurality of joint components each connecting an adjacent pair of said plurality of structural components; and
   a plurality of locking structures each formed on an edge of at least one of said plurality of structural components,
   wherein said plurality of joint components each comprise a material that has a first phase that is substantially rigid to hold said plurality of structural components in a substantially rigid configuration while said material is in said first phase, and said material has a second phase such that said plurality of joint components are at least partially fluid to allow said plurality of structural components to move relative to each other while said material is in said second phase so as to effect self-assembly into a folded configuration to form a sub-centimeter and self- assembled enclosing structure,
   wherein said plurality of locking structures are arranged such that said plurality of structural components lock together via said plurality of locking structures to form said sub-centimeter and self-assembled enclosing structure,
   wherein said sub-centimeter and self-assembled enclosing structure is formed at least partially from a biodegradable polymer,
   wherein said plurality of structural components comprise a biocompatible polymer material selected from the list of materials consisting of SU8, poly(propylene), Poly (esters), Polyimides, and Gelatin,
   wherein said plurality of joint components comprise a biocompatible polymer material selected from the list of materials consisting of Gelatin, poly(caprolactone), and chitosan, and the material of said plurality of joint components is retained within said sub-centimeter and self-assembled enclosing structure, and wherein said plurality of locking structures comprise a biocompatible polymer material selected from the list of materials consisting of Gelatin, Poly(caprolactone), chitosan, alginate, and poly(NIPAAm), and said material of said plurality of locking structures is provided at edges of said plurality of structural components such that when at least two of said plurality of structural components are brought next to each other to form the sub-centimeter and self-assembled enclosing structure, the material on opposite edges overlap to form overlapping edges of the sub-centimeter and self-assembled enclosing structure.

2. A sub-centimeter and self-assembled structure according to claim 1, wherein said joint components interact with said plurality of structural components due to a surface tension of said material of said plurality of joint components.

3. A sub-centimeter and self-assembled enclosing structure according to claim 1, wherein said sub-centimeter and self-assembled enclosing structure has a maximum dimension of at least 10 nm and less than 10 mm.

4. A sub-centimeter and self-assembled enclosing structure according to claim 1, wherein said sub-centimeter and self-assembled enclosing structure has a maximum dimension of at least 10 nm and less than 1 mm.

5. A sub-centimeter and self-assembled enclosing structure according to claim 1, wherein said sub-centimeter and self-assembled enclosing structure is substantially transparent to visible light substantially across the visible region of the electromagnetic spectrum.

6. A sub-centimeter and self-assembled enclosing structure according to claim 1, wherein said plurality of joint components comprise a biodegradable material.

7. A sub-centimeter and self-assembled enclosing structure according to claim 1, wherein at least one of said plurality of structural components defines at least one through hole to permit fluids to pass therethrough.

8. A sub-centimeter and self-assembled enclosing structure according to claim 1, further comprising a surface material disposed on at least one of said plurality of structural components to at least one of provide or facilitate interactions with a local environment of said sub-centimeter and self-assembled enclosing structure.

9. A sub-centimeter and self-assembled enclosing structure according to claim 8, wherein said surface material comprises a hydrogel.

10. A sub-centimeter and self-assembled enclosing structure according to claim 1, further comprising at least one of an electronic, an electro-optical or an optical component.

11. An array comprising a plurality of sub-centimeter and self-assembled structures, wherein each of said plurality of sub-centimeter and self-assembled structures comprises:
a plurality of structural components;
a plurality of joint components each connecting an adjacent pair of said plurality of structural components; and
a plurality of locking structures each formed on an edge of at least one of said plurality of structural components,
wherein said plurality of joint components each comprise a material that has a first phase that is substantially rigid to hold said plurality of structural components in a substantially rigid configuration while said material is in said first phase, and said material has a second phase such that said plurality of joint components are at least partially fluid to allow said plurality of structural components to move relative to each other while said material is in said second phase so as to effect self-assembly into a folded configuration to form a sub-centimeter and self- assembled enclosing structure,
wherein said plurality of locking structures are arranged such that said plurality of structural components lock together via said plurality of locking structures to form said sub- centimeter and self-assembled enclosing structure,
wherein said sub-centimeter and self-assembled enclosing structure is formed at least partially from a biodegradable polymer,
wherein said plurality of structural components comprise a biocompatible polymer material selected from the list of materials consisting of SU8, poly(propylene), Poly(esters), Polyimides, and Gelatin,
wherein said plurality of joint components comprise a biocompatible polymer material selected from the list of materials consisting of Gelatin, poly(caprolactone), and chitosan, and the material of said plurality of joint components is retained within said sub-centimeter and self-assembled enclosing structure, and
wherein said plurality of locking structures comprise a biocompatible polymer material selected from the list of materials consisting of Gelatin, Poly(caprolactone), chitosan, alginate, and poly(NIPAAm), and said material of said plurality of locking structures is provided at edges of said plurality of structural components such that when at least two of said plurality of structural components are brought next to each other to form the sub-centimeter and self-assembled enclosing structure, the material on opposite edges overlap to form overlapping edges of the sub-centimeter and self-assembled enclosing structure.

12. An array according to claim 11, further comprising a substrate, wherein said plurality sub-centimeter and self-assembled structures are attached to said substrate.

13. An array according to claim 11, wherein each of said plurality of sub-centimeter and self-assembled structures has an open end for receiving material to be loaded into said array.

14. An array according to claim 11, wherein each of said plurality of sub-centimeter and self-assembled structures has a plurality of porous sides to allow fluid flow there through.

15. A composition comprising a plurality of sub-centimeter and self-assembled structures, wherein each of said plurality of sub-centimeter and self-assembled structures comprises:
a plurality of structural components;
a plurality of joint components each connecting an adjacent pair of said plurality of structural components; and
a plurality of locking structures each formed on an edge of at least one of said plurality of structural components,
wherein said plurality of joint components each comprise a material that has a first phase that is substantially rigid to hold said plurality of structural components in a substantially rigid configuration while said material is in said first phase, and said polymer has a second phase such that said plurality of joint components are at least partially fluid to allow said plurality of structural components to move relative to each other while said material is in said second phase so as to effect self-assembly into a folded configuration to form a sub-centimeter and self- assembled enclosing structure,
wherein said plurality of locking structures are arranged such that said plurality of structural components lock together via said plurality of locking structures to form said sub- centimeter and self-assembled enclosing structure, wherein said sub-centimeter and self-assembled enclosing structure is formed at least partially from a biodegradable polymer, wherein said plurality of structural components comprise a biocompatible polymer material selected from the list of materials consisting of SU8, poly(propylene), Poly(esters), Polyimides, and Gelatin, wherein said plurality of joint components comprise a biocompatible polymer material selected from the list of materials consisting of Gelatin, poly(caprolactone), and chitosan, and the material of said plurality of joint components is retained within said sub-centimeter and self-assembled enclosing structure, and wherein said plurality of locking structures comprise a biocompatible polymer material selected from the list of materials consisting of Gelatin, Poly(caprolactone), chitosan, alginate, and poly(NIPAAm), and said material of said plurality of locking structures is provided at edges of said plurality of structural components such that when at least two of said plurality of structural components are brought next to each other to form the sub-centimeter and self-assembled enclosing structure, the material on opposite edges overlap to form overlapping edges of the sub-centimeter and self-assembled enclosing structure.

16. A composition according to claim 15, further comprising a cargo material contained within said each of said plurality of sub-centimeter and self-assembled structures.

17. A composition according to claim 16, wherein said cargo material comprises at least one of a living organism, a living cell, an organic molecule, an inorganic molecule or an atomic element.

18. A composition according to claim 16, wherein said cargo material comprises at least one of a therapeutic agent, a micro-bead, a cell, a tissue, a gel, a dye, a natural polymer, or a synthetic polymer.

19. A composition according to claim 15, further comprising a medium in which said plurality of sub-centimeter and self-assembled structures are dispersed.

20. A method of producing a sub-centimeter and self-assembled structure, comprising:

providing a plurality of structural components;

providing a plurality of joint components each connecting an adjacent pair of said plurality of structural components and each comprising a material;

providing a plurality of locking structures each formed on an edge of at least one of said plurality of structural components; and exposing said plurality of joint components to heat such that said plurality of joint components changes phase from a substantially rigid phase to an at least partially fluid phase such that said plurality of joint components are at least partially fluid to allow said plurality of structural components to move relative to each other while said plurality of joint components are in said partially fluid phase so as to effect self-assembly of said plurality of structural components into a folded configuration to form a sub-centimeter and self-assembled enclosing structure, wherein said plurality of locking structures are arranged such that said plurality of structural components lock together via said plurality of locking structures to form said sub-centimeter and self-assembled enclosing structure, wherein said sub-centimeter and self-assembled enclosing structure is formed at least partially from a biodegradable polymer, wherein said plurality of structural components comprise a biocompatible polymer material selected from the list of materials consisting of SU8, poly(propylene), Poly(esters), Polyimides, and Gelatin, wherein said plurality of joint components comprise a biocompatible polymer material selected from the list of materials consisting of Gelatin, poly(caprolactone), and chitosan, and the material of said plurality of joint components is retained within said sub-centimeter and self-assembled enclosing structure, and wherein said plurality of locking structures comprise a biocompatible polymer material selected from the list of materials consisting of Gelatin, Poly(caprolactone), chitosan, alginate, and poly(NIPAAm), and said material of said plurality of locking structures is provided at edges of said plurality of structural components such that when at least two of said plurality of structural components are brought next to each other to form the sub-centimeter and self- assembled enclosing structure, the material on opposite edges overlap to form overlapping edges of the sub-centimeter and self-assembled enclosing structure.

21. A method of producing a sub-centimeter and self-assembled structure according to claim 20, wherein said plurality of structural components are produced by a lithographic process.

22. A method of producing a sub-centimeter and self-assembled structure according to claim 21, wherein said lithographic process is a photolithographic process and said first and second structural components comprise a photoactive material.

23. The sub-centimeter and self-assembled enclosing structure according to claim 1, wherein the sub-centimeter and self-assembled enclosing structure is configured to transform from an open configuration to a folded configuration to encapsulate a substance within the enclosing structure when the material of the plurality of joint components that connects the plurality of structural components of the enclosing structure is in the second phase in which the polymer is at least partially fluid.

24. The sub-centimeter and self-assembled enclosing structure of claim 1, wherein the material of the plurality of joints has a melting temperature lower than a melting temperature of the material of the plurality of locking structures, and wherein the material of the plurality of locking structures has a melting temperature that is lower than a melting temperature of the plurality of structural components.

25. The sub-centimeter and self-assembled enclosing structure of claim 1, wherein the material of said plurality of joint components has the first phase that is substantially rigid at a first temperature, and said material has the second phase at a second temperature, wherein said first temperature is lower than said second temperature.

* * * * *